(12) United States Patent
Sakane

(10) Patent No.: US 9,991,100 B2
(45) Date of Patent: Jun. 5, 2018

(54) PLASMA PROCESSING APPARATUS AND CONTROL METHOD

(71) Applicant: Tokyo Electron Limited, Tokyo (JP)

(72) Inventor: Ryota Sakane, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days. days.

(21) Appl. No.: 15/413,631

(22) Filed: Jan. 24, 2017

(65) Prior Publication Data

US 2017/0213703 A1    Jul. 27, 2017

(30) Foreign Application Priority Data

Jan. 26, 2016 (JP) ................. 2016-012720

(51) Int. Cl.
*H01J 37/32* (2006.01)
*H01L 21/3065* (2006.01)
*H01L 21/67* (2006.01)

(52) U.S. Cl.
CPC .... *H01J 37/3299* (2013.01); *H01J 37/32082* (2013.01); *H01J 37/32091* (2013.01); *H01J 37/32183* (2013.01); *H01J 37/32568* (2013.01); *H01J 37/32642* (2013.01); *H01L 21/3065* (2013.01); *H01L 21/67069* (2013.01); *H01J 2237/3343* (2013.01)

(58) Field of Classification Search
None
See application file for complete search history.

(56) References Cited

U.S. PATENT DOCUMENTS

| 8,299,390 | B2 | 10/2012 | Dhindsa et al. |
| 8,652,297 | B2 | 2/2014 | Collins et al. |
| 2009/0126634 | A1* | 5/2009 | Yamazawa .......... C23C 16/5096 118/723 R |
| 2010/0126847 | A1* | 5/2010 | Dhindsa ............ H01J 37/32174 204/164 |

FOREIGN PATENT DOCUMENTS

JP    2009-164608 A    7/2009

* cited by examiner

*Primary Examiner* — Jany Richardson
(74) *Attorney, Agent, or Firm* — Rothwell, Figg, Ernst & Manbeck, P.C.

(57) ABSTRACT

The plasma processing apparatus includes a first electrode to which high frequency power is applied, a second electrode that functions as a counter electrode with respect to the first electrode, and a controller configured to control distribution of plasma generated between the first electrode and the second electrode. The first electrode is, for example, an upper electrode. The second electrode includes a lower electrode, and a peripheral portion disposed around the lower electrode. The peripheral portion includes a plurality of split electrodes divided in a peripheral direction. For each split electrode, the controller controls an impedance between the plasma and a ground via the split electrode.

11 Claims, 22 Drawing Sheets

PERIPHERAL DIRECTION

PLASMA PROCESSING APPARATUS AND CONTROL METHOD

CROSS-REFERENCE TO RELATED APPLICATIONS

This application is based on and claims priority from Japanese Patent Application No. 2016-012720 filed on Jan. 26, 2016 with the Japan Patent Office, the disclosure of which is incorporated herein in its entirety by reference.

TECHNICAL FIELD

Various aspects and embodiments of the present disclosure relate to a plasma processing apparatus and a control method.

BACKGROUND

A semiconductor manufacturing process includes a process of performing a processing using plasma. In the processing process using plasma, the uniformity of the plasma generated in a processing apparatus is one of important factors that determine the properties of a semiconductor to be manufactured. Therefore, the processing process using plasma is required to control the distribution of plasma with high precision. In order to reduce the bias of plasma generated in the processing apparatus, a plasma generating space in the processing apparatus may be made to have a symmetrical structure. However, in many cases, even if the plasma generating space is designed to have a symmetrical structure, the space within the processing apparatus is not formed to have a symmetrical structure due to, for example, errors in the processing dimensions of components, variations in assembly, or consumption of components.

To avoid this, a technique has been known in which an electrode for generating plasma is divided into a central portion and a peripheral portion, and the impedance between the central portion and a ground and the impedance between the peripheral portion and the ground are controlled so as to control the distribution of plasma in a diametric direction. In addition, a technique has been known in which a device that controls the impedance between a power supply unit and a ground is provided around the power supply unit that applies high frequency power to an electrode, and the distribution of high frequency power applied to the electrode is controlled in a peripheral direction. See, for example, U.S. Pat. No. 8,299,390, Japanese Patent Laid-open Publication No. 2009-164608, and U.S. Pat. No. 8,652,297.

SUMMARY

An aspect of the present disclosure is a plasma processing apparatus including a first electrode to which high frequency power is applied, a second electrode configured to function as a counter electrode facing the first electrode, and a controller to control distribution of plasma generated between the first electrode and the second electrode. The second electrode includes a central portion and a peripheral portion disposed around the central portion. The peripheral portion includes a plurality of split electrodes divided in a peripheral direction. The controller controls an impedance between the plasma and a ground via each of the plurality of split electrodes.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
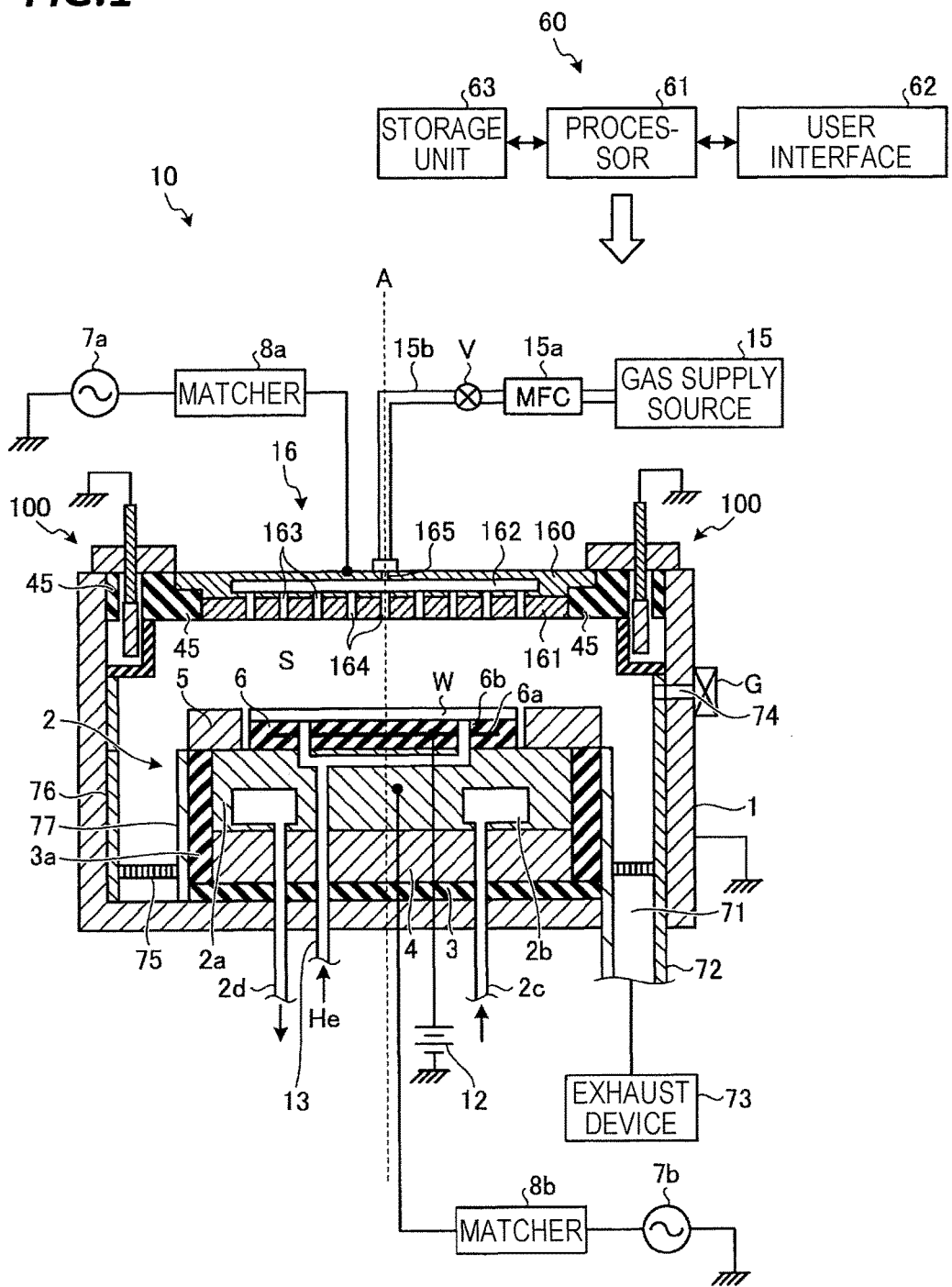
FIG. 1 is a cross-sectional view illustrating an example of a plasma processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

There is no method that controls the distribution of plasma generated in a processing apparatus with respect to a diametric direction and a peripheral direction at the same time. Therefore, it is required to control the distribution of plasma generated in the processing apparatus with respect to the diametric direction and the peripheral direction at the same time.

According to an aspect of the present disclosure, a plasma processing apparatus includes: a first electrode to which high frequency power is applied; a second electrode that functions as a counter electrode with respect to the first electrode; and a controller that controls distribution of plasma generated between the first electrode and the second electrode. The second electrode includes a central portion and a peripheral portion disposed around the central portion, the peripheral portion includes a plurality of split electrodes divided in a peripheral direction, and the controller controls an impedance between the plasma and a ground via each of the plurality of split electrodes.

According to an exemplary embodiment of the plasma processing apparatus, each of the split electrodes may be a grounded conductor. The controller may control a position of each split electrode in a direction orthogonal to an electrode surface of the first electrode facing the second electrode, a position of each split electrode in a direction parallel to the electrode surface, or both the positions, thereby controlling the impedance between the plasma and the ground via each split electrode.

According to an exemplary embodiment of the plasma processing apparatus, each split electrode may be a conductor grounded via a first variable impedance circuit. The controller may control an impedance of the first variable impedance circuit connected to each split electrode, thereby controlling the impedance between the plasma and the ground via each split electrode.

According to an exemplary embodiment of the plasma processing apparatus, the first variable impedance circuit may be a switch that controls conduction and non-conduction between the split electrode and the ground.

According to an exemplary embodiment of the plasma processing apparatus, the first variable impedance circuit may include at least one of a variable resistor, a variable condenser, and a variable inductor.

According to an exemplary embodiment of the plasma processing apparatus, the plasma processing apparatus may further include a measurement unit connected to each split electrode for measuring at least one of a voltage between the split electrode and the ground and current flowing to the split electrode. The controller may control the impedance between the plasma and the ground via each split electrode so as to cause at least one of the voltage and the current of each split electrode to satisfy a predetermined relationship among the plurality of split electrodes.

According to an exemplary embodiment of the plasma processing apparatus, the split electrode may be a plate-shaped conductor, and may be disposed around the central portion so that a thickness direction of the split electrode is a diametric direction.

According to an exemplary embodiment of the plasma processing apparatus, the split electrode may be a rod-shaped conductor, and may be disposed around the central portion so that a longitudinal direction of the split electrode is the direction orthogonal to the electrode surface of the first electrode facing the second electrode.

According to an exemplary embodiment of the plasma processing apparatus, the central portion of the second electrode may be grounded, and the central portion of the second electrode may be grounded via a second variable impedance circuit.

According to another aspect of the present disclosure, provided is a control method of a plasma processing apparatus including: a first electrode to which high frequency power is applied; a second electrode configured to function as a counter electrode with respect to the first electrode; and a controller configured to control distribution of plasma generated between the first electrode and the second electrode, the second electrode including a central portion and a peripheral portion disposed around the central portion, and the peripheral portion including a plurality of split electrodes divided in a peripheral direction. The controller executes: a process of measuring at least one of a voltage between each split electrode and a ground and current flowing to the split electrode; a process of determining an impedance between the plasma and the ground via each split electrode so as to cause at least one of the voltage and the current of each split electrode to satisfy a predetermined relationship among the plurality of split electrodes; and a process of controlling the impedance between the plasma and the ground via each split electrode so as to be the same as the determined impedance.

According to various aspects and embodiments of the present disclosure, the uniformity of plasma generated in a plasma processing apparatus may be improved.

Hereinafter, an exemplary embodiment of a plasma processing apparatus and a control method disclosed herein will be described in detail with reference to the accompanying drawings. In addition, the plasma processing apparatus and the control method disclosed herein are not limited by the present exemplary embodiment.

First Exemplary Embodiment

FIG. 1 is a cross-sectional view illustrating an example of a plasma processing apparatus 10. The plasma processing apparatus 10 in the present exemplary embodiment is, for example, a capacitively coupled parallel plate plasma etching apparatus. The plasma processing apparatus 10 includes a chamber 1, which is formed of, for example, aluminum that has an anodized surface. The chamber 1 has a substantially cylindrical space defined therein. The chamber 1 is grounded for safety. The chamber 1 is arranged in such a manner that the center axis of the substantially cylindrical space defined by the inner sidewall of the chamber 1 coincides with the axis A illustrated in FIG. 1.

A substantially cylindrical placing table 2 is provided within the chamber 1 so as to place a semiconductor wafer W thereon. The placing table 2 includes a lower electrode 2a, a base 4, a focus ring 5, and an electrostatic chuck 6. The base 4 is formed of, for example, ceramics, and is disposed on the bottom portion of the chamber 1 via an insulation plate 3. The lower electrode 2a, which is formed of, for example, aluminum, is provided on the base 4.

The electrostatic chuck 6 is provided on the top surface of the lower electrode 2a to attract and hold the semiconductor wafer W by an electrostatic force. The electrostatic chuck 6 has a structure in which an electrode 6a formed of a conductive film is sandwiched between a pair of insulation layers 6b. A direct current (DC) power source 12 is electrically connected to the electrode 6a. The semiconductor wafer W is placed on the top surface of the electrostatic chuck 6, and is attracted to and held on the top surface of the electrostatic chuck 6 by an electrostatic force generated on the surface of the electrostatic chuck 6 by the DC voltage supplied from the DC power source 12.

A conductive focus ring 5, which is formed of, for example, monocrystalline silicon, is provided on the top surface of the lower electrode 2a so as to surround the electrostatic chuck 6. The uniformity of a plasma processing, such as, for example, etching on the surface of the semiconductor wafer W, is improved by the focus ring 5. The side surfaces of the lower electrode 2a and the base 4 are surrounded by a cylindrical inner wall member 3a, which is formed of, for example, quartz.

For example, an annular coolant chamber 2b is formed within the lower electrode 2a. A coolant (e.g., galden) is circulated and supplied to the coolant chamber 2b from a chiller unit (not illustrated) provided at the outside through pipes 2c and 2d. The temperature of the lower electrode 2a, the base 4, and the electrostatic chuck 6 is controlled by the coolant circulated inside the coolant chamber 2b, so that the semiconductor wafer W on the electrostatic chuck 6 is controlled to a predetermined temperature.

In addition, a heat transfer gas (e.g., He gas) is supplied from a heat transfer gas supply mechanism (not illustrated) to a gap between the top surface of the electrostatic chuck 6 and the rear surface of the semiconductor wafer W mounted on the electrostatic chuck 6 through a pipe 13.

A high frequency power source 7b is connected to the lower electrode 2a via a matcher 8b. The high frequency power source 7b supplies high frequency power of a predetermined frequency (e.g., 13 MHz) used for ion attraction (bias), to the lower electrode 2a.

An exhaust path 71 is provided around the placing table 2 so as to surround the placing table 2. A baffle plate 75 having a plurality of through-holes is provided within the exhaust path 71. An exhaust device 73 is connected to the exhaust path 71 through an exhaust port 72. The exhaust device 73 includes a vacuum pump (e.g., a turbo molecular pump), and may decompress the inside of the chamber 1 to a desired vacuum degree.

An opening 74 is provided in the sidewall of the chamber 1, and a gate valve G is provided to the opening 74 to open or close the opening 74. In addition, deposition shields 76 and 77 are detachably provided on the inner sidewall of the chamber 1 and the outer sidewall of the placing table 2, respectively. The deposition shields 76 and 77 prevent deposit from being attached to the inner sidewall of the chamber 1.

An upper electrode 16 is provided above the lower electrode 2a to face the placing table 2. The lower electrode 2a and the upper electrode 16 are provided substantially in parallel with each other within the chamber 1. Hereinafter, a space between the semiconductor wafer W placed on the electrostatic chuck 6 and the lower surface of the upper electrode 16 is often referred to as a processing space S.

The upper electrode 16 is supported in the upper portion of the chamber 1 via an insulation member 45. The upper electrode 16 includes a ceiling plate support unit 160 and an upper ceiling plate 161. The ceiling plate support unit 160 is formed of, for example, aluminum having an anodized surface, substantially in a disc shape, and detachably supports the upper ceiling plate 161 therebelow. The upper ceiling plate 161 is formed of, for example, a silicon-containing material (e.g., Si, SiC or quartz) substantially in a disc shape. The bottom surface of the upper ceiling plate 161 is an example of an electrode surface.

A high frequency power source 7a is connected to the ceiling plate support unit 160 via a matcher 8a. The high frequency power source 7a supplies high frequency power of a predetermined frequency (e.g., 60 MHz) used for plasma generation to the ceiling plate support unit 160.

A gas diffusion chamber 162 is provided inside the ceiling plate support unit 160. A plurality of gas distribution holes 163 are formed in the bottom portion of the ceiling plate support unit 160 to be located below the gas diffusion chamber 162. The plurality of gas distribution holes 163 are formed below the gas diffusion chamber 162 at substantially equal intervals concentrically around the axis A.

A plurality of gas distribution holes 164 are provided in the upper ceiling plate 161 to penetrate the upper ceiling plate 161 in a thickness direction. The plurality of gas distribution holes 164 are formed in the upper ceiling plate 161 at substantially equal intervals concentrically around the axis A. Each gas distribution hole 164 communicates with one of the gas distribution holes 163. A processing gas supplied to the gas diffusion chamber 162 is diffused in a shower form and supplied into the chamber 1 through the plurality of gas distribution holes 163 and 164. In addition, the plurality of gas distribution holes 163 and 164 are arranged at substantially equal intervals concentrically around the axis A. Therefore, the processing gas supplied into the chamber 1 through the plurality of gas distribution holes 163 and 164 is supplied into the processing space S at a substantially uniform flow rate in a peripheral direction about the axis A.

For example, the upper electrode 16 may be provided with a temperature adjustment mechanism such as, for example, a heater (not illustrated) or a pipe (not illustrated) for circulating a coolant, so that the upper electrode 16 may be controlled to a temperature within a desired range during the processing of the semiconductor wafer W. In addition, when plasma is generated in the processing space S within the chamber 1, a negative DC voltage may be applied to the upper electrode 16 via a low pass filter (LPF) as needed.

The ceiling plate support unit 160 of the upper electrode 16 is provided with a gas introduction hole 165 to introduce the processing gas into the gas diffusion chamber 162. The gas introduction hole 165 may be disposed such that the axis A passes through the center of the gas introduction hole 165. One end of a pipe 15b is connected to the gas introduction hole 165. The other end of the pipe 15b is connected to a gas supply source 15 that supplies the processing gas to be used in the processing of the semiconductor wafer W through a valve V and a mass flow controller (MFC) 15a. The processing gas supplied from the gas supply source 15 is supplied to the gas diffusion chamber 162 through the pipe 15b, thereby being diffused in a shower form, and supplied into the chamber 1 through the gas distribution holes 163 and 164.

Figure 2:
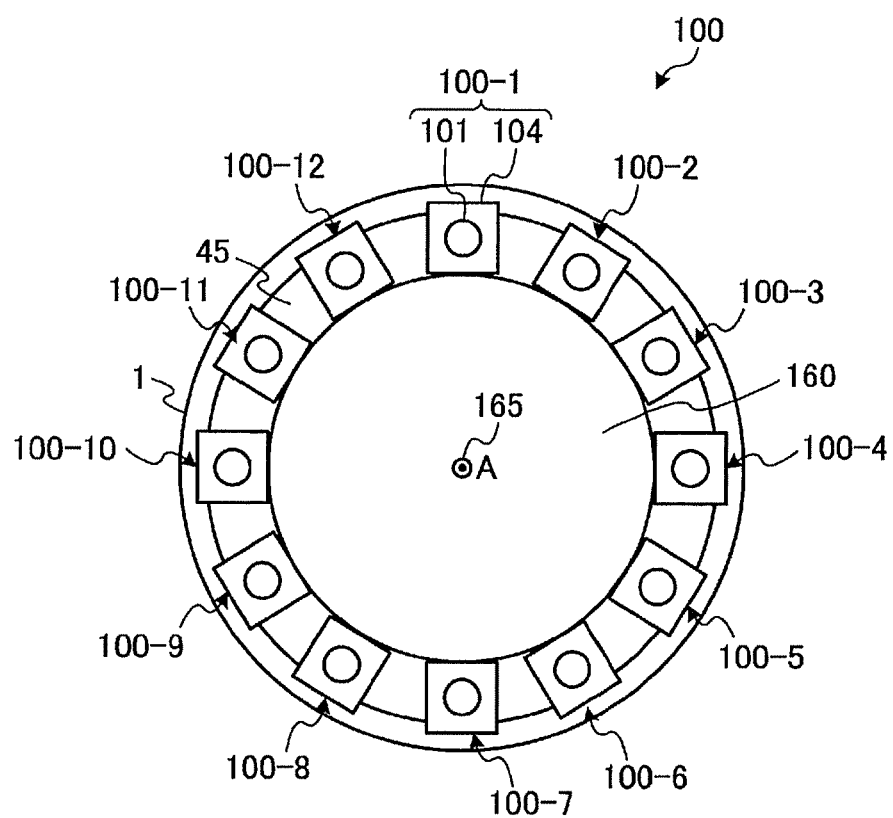
FIG. 2 is a view illustrating an example of the top side of the plasma processing apparatus in a first exemplary embodiment.

A plurality of distribution adjustment units 100 are arranged above and around the placing table 2 along the sidewall of the chamber 1 to surround the processing space S. For example, as illustrated in FIG. 2, the distribution adjustment units 100 are arranged at substantially equal intervals circularly around the axis A, and control the distribution of plasma generated in the processing space S. FIG. 2 is a view illustrating an example of the top side of the plasma processing apparatus 10 in the first exemplary embodiment. In the present exemplary embodiment, twelve (12) distribution adjustment units 100 are arranged in the chamber 1 to surround the processing space S. In addition, the number of distribution adjustment units 100 may be below 12, or above 12 so long as the distribution adjustment units 100 are arranged circularly around the axis A, for example, as illustrated in FIG. 2.

<Structure of Distribution Adjustment Unit 100>

Figure 3:
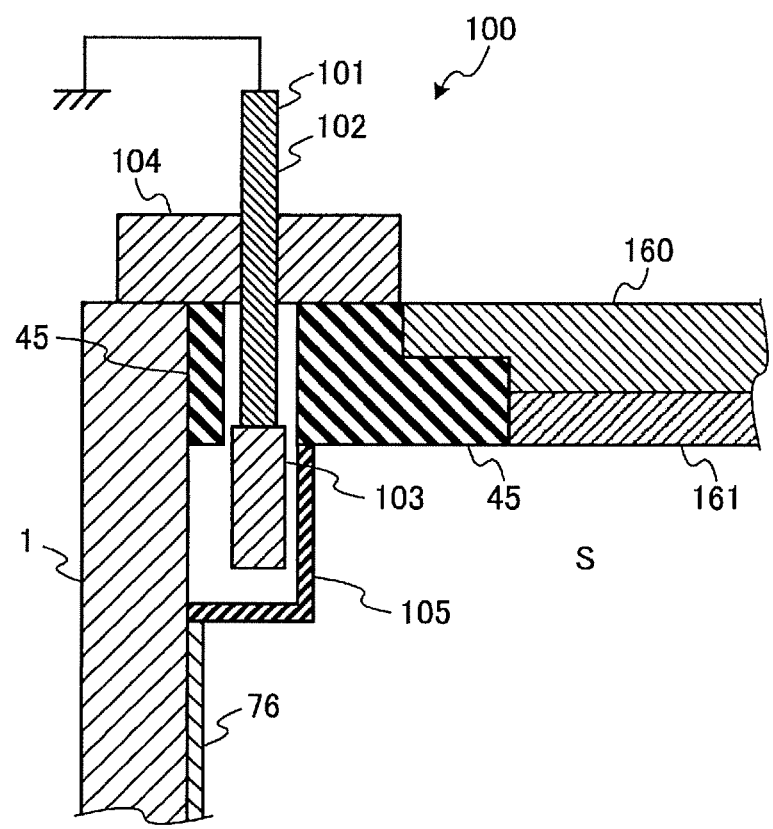
FIG. 3 is an enlarged cross-sectional view illustrating an example of a distribution adjustment unit in the first exemplary embodiment.

FIG. 3 is an enlarged cross-sectional view illustrating an exemplary distribution adjustment unit 100 in the first exemplary embodiment. In the present exemplary embodiment, the distribution adjustment unit 100 includes a split electrode 101 and an actuator 104. The split electrode 101 is inserted, through a through-hole formed in the insulation member 45, into a space located below the upper electrode 16 and surrounded by the chamber 1, the insulation member 45, and an insulation member 105.

The actuator 104 is, for example, an air cylinder, and moves the split electrode 101 in the vertical direction along the axis A. The vertical direction refers to a direction that is orthogonal to the electrode surface that is the bottom surface of the upper ceiling plate 161 facing the lower electrode 2a. The actuator 104 moves the split electrode 101 in the vertical direction along the axis A by a moving amount indicated from the controller 60 in response to an instruction from the controller 60.

Figure 4:
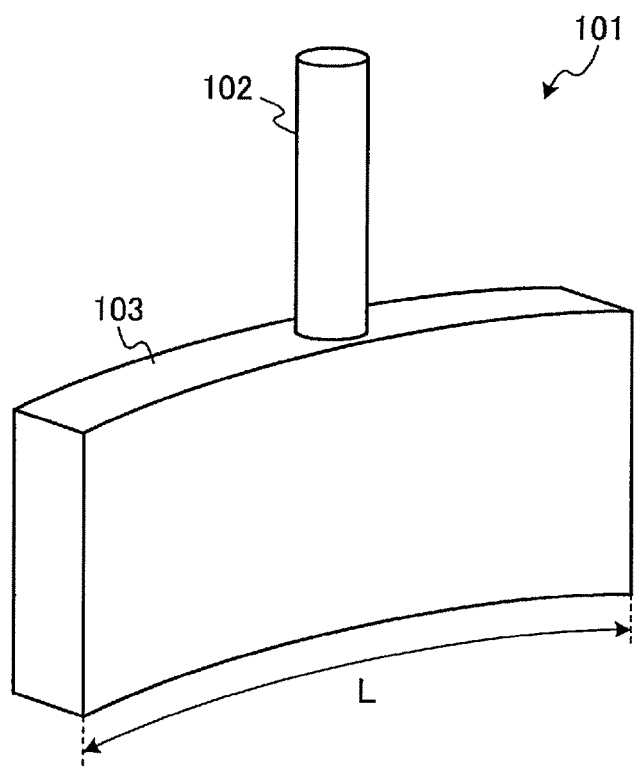
FIG. 4 is a perspective view illustrating an example of a split electrode.

FIG. 4 is a perspective view illustrating an exemplary split electrode 101. The split electrode 101 is formed of a conductor (e.g., aluminum), and includes a support rod 102 and a plate portion 103. In the present exemplary embodiment, the plate portion 103 is curved in a shape that follows the side wall of the substantially cylindrical chamber 1. The width L of the plate portion 103 in the peripheral direction of a circle, of which the center axis is the axis A, is the length obtained by subtracting the distance of a gap provided between the plate portions 103 of the neighboring distribution adjustment units 100 from the length obtained by equally dividing the circle, of which the radius is the distance from the axis A to the position at which the split electrode 101 is disposed, by the number of the distribution adjustment units 100. The gap provided between the plate portions 103 of the neighboring distribution adjustment units 100 may be narrow. The split electrode 101 is located in the chamber 1 such that the thickness direction of the plate portion 103 is oriented to the diametric direction of the circle, of which the center axis is the axis A. In addition, the plate portion 103 may have a flat shape, rather than being curved.

In the present exemplary embodiment, the split electrode 101 is grounded. The split electrode 101 may be connected to a ground potential via any method using for example, a cable, a metal plate, an oil-free metal bush, or a metal seal, so long as the method is a connection method that maintains the connection between the split electrode 101 and the ground potential even if the split electrode 101 moves.

As the actuator 104 moves the split electrode 101 in the vertical direction, the impedance between a ground and plasma in the processing space S varies via the split electrode 101. In this manner, the distribution of high frequency power in the processing space S varies, and the distribution of plasma generated in the processing space S varies. In each distribution adjustment unit 100, the position of the split electrode 101 in the vertical direction is independently controllable. Therefore, the distribution of plasma is independently controlled between the processing space S and each distribution adjustment unit 100. In this manner, the distribution of plasma generated in the processing space S may be controlled in each of the peripheral direction and the diametric direction of the circle, of which the center axis is the axis A, in the processing space S.

In addition, the upper electrode 16 functions as a cathode to which high-frequency power for plasma generation is applied. Meanwhile, the lower electrode 2a and each split electrode 101 function as an anode that is a counter electrode with respect to the upper electrode 16, for high frequency power for plasma generation. The upper electrode 16 is an example of a first electrode, and the lower electrode 2a and the plurality of split electrodes 101 are an example of a second electrode. In addition, the lower electrode 2a is an example of the central portion in the second electrode, and the plurality of split electrodes 101 are an example of the peripheral portion disposed around the lower electrode 2a.

An operation of the substrate processing apparatus 10 configured as described above is generally controlled by a controller 60. The controller 60 includes a processor 61 that includes a central processing unit (CPU) and controls respective components of the plasma processing apparatus 10, a user interface 62, and a storage unit 63.

The user interface 62 includes, for example, a keyboard that is used by an operator to input, for example, a command for operating the plasma processing apparatus 10, or a display that visualizes and displays an operating state of the plasma processing apparatus 10.

The storage unit 63 stores, for example, a control program (software) to enable the processor 61 to implement various processings executed in the plasma processing apparatus 10, or a recipe in which, for example, processing condition data is stored. The processor 61 reads the control program stored in the storage unit 63, and operates based on the read control program. Then, the processor 61 reads, for example, the recipe from the storage unit 63 in response to, for example, an instruction received via the user interface 62, and controls the plasma processing apparatus 10 based on, for example, the read recipe. Thus, a desired processing is performed by the plasma processing apparatus 10. In addition, the processor 61 may read, for example, a control program or a recipe from, for example, a computer-readable recording medium that stores the control program or the recipe, and execute the read control program or recipe. The computer-readable recording medium is, for example, a hard disc, a digital versatile disc (DVD), a flexible disc, or a semiconductor memory. In addition, the processor 61 may acquire, for example, a control program or a recipe from another device that stores the control program or the recipe in a storage unit thereof through, for example, a communication line, and execute the acquired control program or the recipe.

In a case where a processing is performed using plasma on the semiconductor wafer W in the plasma processing apparatus 10, the controller 60 performs the following controls on the plasma processing apparatus 10. First, the controller 60 controls the valve V and the MFC 15a in the state where the semiconductor wafer W is placed on the electrostatic chuck 6 to supply a processing gas into the gas diffusion chamber 162 at a predetermined flow rate. The processing gas supplied into the gas diffusion chamber 162 is diffused in a shower form, and supplied into the chamber 1 through the plurality of gas distribution holes 163 and 164. In addition, the controller 60 operates the exhaust device 73 to control the inside of the chamber 1 to a predetermined pressure.

In addition, the controller 60 causes the high frequency power source 7a to generate predetermined high frequency power, and causes the high frequency power to be applied to the upper electrode 16. Further, the controller 60 causes the high frequency power source 7b to generate predetermined high frequency power, and causes the high frequency power to be applied to the lower electrode 2a. Thus, the plasma of the processing gas is generated in the processing space S between the semiconductor wafer W on the electrostatic chuck 6 and the upper electrode 16. Then, a predetermined processing (e.g., etching) is performed on the semiconductor wafer W placed on the electrostatic chuck 6 by ions or radicals included in the plasma generated in the processing space S.

<Simulation Result>

Figure 5:
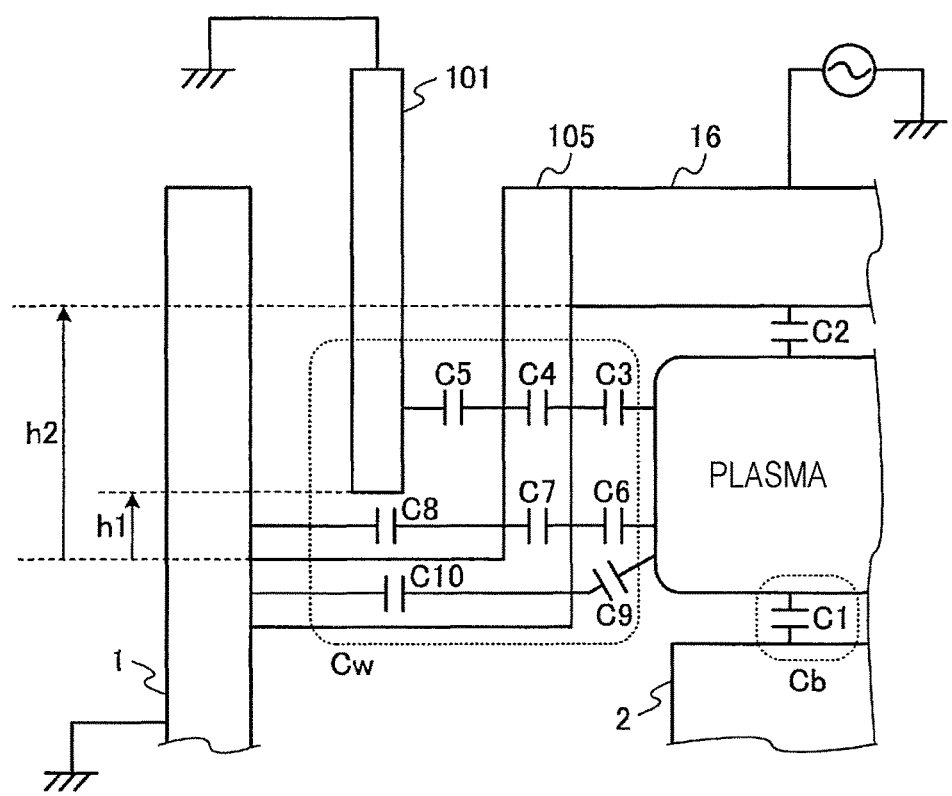
FIG. 5 is a view illustrating an example of an equivalent circuit near the distribution adjustment unit.

FIG. 5 is a view illustrating an example of an equivalent circuit near the distribution adjustment unit 100. The capacity between the placing table 2 and plasma generated in the processing space S is defined as "C1," the capacity between the plasma and the upper electrode 16 is defined as "C2," and the capacities between the plasma and the sidewall of the chamber 1 are defined as "C3 to C10," respectively. When the position of the split electrode 101 varies in the vertical direction, the capacity C5 and the capacity C8 represented in FIG. 5 vary. In this way, the impedance between the plasma in the processing space S and a ground varies.

Here, for example, as illustrated in FIG. 5, the capacity C1 between the plasma and the placing table 2 is redefined as "Cb," and the capacitances C3 to C10 between the plasma and the sidewall of the chamber 1 are redefined as the capacity Cw. In addition, for example, as illustrated in FIG. 5, the distance between the lower end of the split electrode 101 and the top surface of the insulation member 105 is defined as "h1" and the height from the top surface of the insulation member 105 to the lower surface of the upper electrode 16 is defined as "h2". Further, the capacity ratio Cw/Cb of the capacity Cw and the capacity Cb when the position of the split electrode 101 varies is calculated by simulation.

When h1 was 0, the capacity ratio Cw/Cb was 1.24. When h1 was h2/2, the capacity ratio Cw/Cb was 0.92. When h1 was h2, the capacity ratio Cw/Cb was 0.60. From this result, it has been found that the capacity ratio Cw/Cb of the capacity Cb between the plasma and the placing table 2 and the capacity Cw between the plasma and the sidewall of the chamber 1 greatly varies depending on an insertion amount of the split electrode 101. When the capacity ratio Cw/Cb varies, the ratio of high frequency power between the central portion and the peripheral portion of the processing space S varies. When the ratio of high frequency power between the central portion and the peripheral portion of the processing space S varies, the distribution of plasma in the central portion and the peripheral portion of the processing space S varies. Thus, the distribution of plasma in the central portion and the peripheral portion of the processing space S may be controlled by controlling the insertion amount of the split electrode 101.

Figure 6:
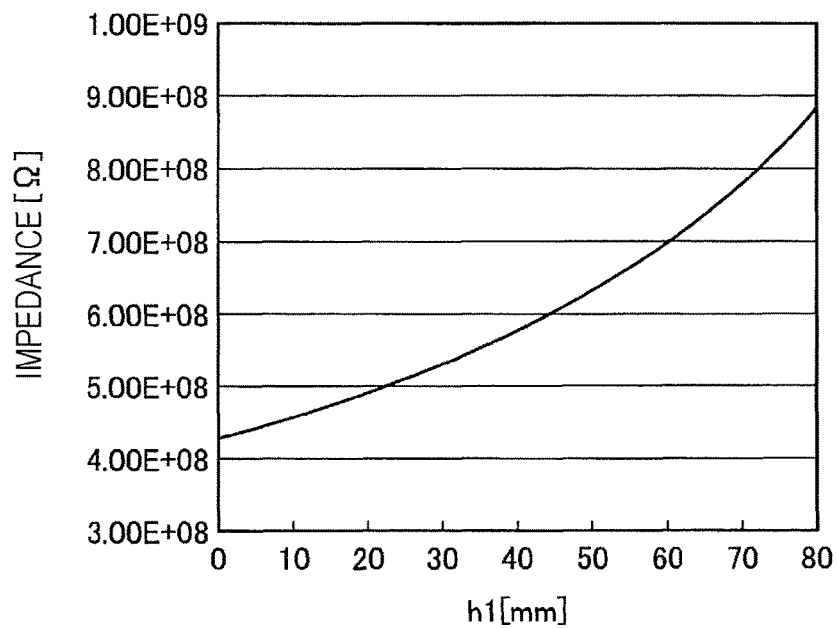
FIG. 6 is a view illustrating an example of variation in the impedance between plasma and the sidewall of a chamber with respect to the position of the split electrode.

In addition, a variation in impedance depending on the capacity Cw was calculated by simulation when the position of the split electrode 101 was changed. FIG. 6 is a view illustrating an example of a variation in impedance between the plasma and the sidewall of the chamber 1 with respect to the position of the split electrode 101. In FIG. 6, the simulation was performed using high frequency power of 40 MHz that is high frequency power for plasma generation.

Referring to the simulation result of FIG. 6, it has been found that the impedance between the plasma and the sidewall of the chamber 1 increases as the insertion amount of the split electrode 101 decreases. This is because the capacity Cw between the plasma and the sidewall of the chamber 1 decreases. In addition, referring to the simulation result of FIG. 6, it has been found that the maximum value of the impedance between the plasma and the sidewall of the chamber 1 is about two times the minimum value as the insertion amount of the split electrode 101 varies. As is apparent from the simulation result of FIG. 6, the distribution of the plasma in the peripheral direction within the processing space S may be controlled by independently controlling the insertion amount of the respective split electrodes 101.

Figure 7:
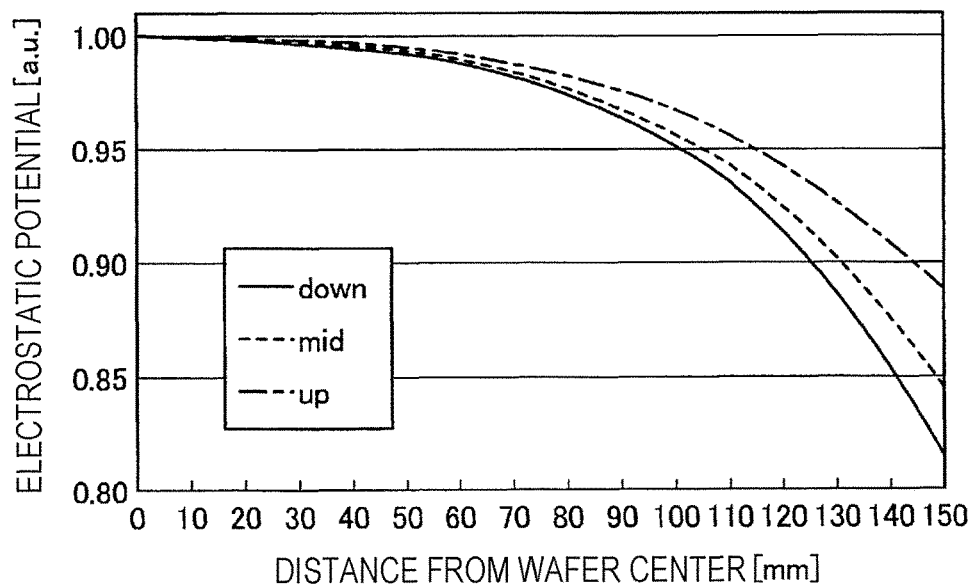
FIG. 7 is a view illustrating an example of the distribution of electrostatic potential.

FIG. 7 is a view illustrating an example of the distribution of electrostatic potential. The indication "down" in FIG. 7 represents the distribution of electrostatic potential when the position of the split electrode 101 is h1=0. The indication "mid" in FIG. 7 represents the distribution of electrostatic potential when the position of the split electrode 101 is h1=2h/2. The indication "up" in FIG. 7 represents the distribution of electrostatic potential when the position of the split electrode 101 is h1=h2. In FIG. 7, the value of the vertical axis is standardized as electrostatic potential at the center position of the semiconductor wafer W (i.e., the position on the semiconductor wafer W through which the axis A passes). Referring to FIG. 7, it has been found that the distribution of electrostatic potential varies depending on the insertion amount of the split electrode 101.

Figure 8:
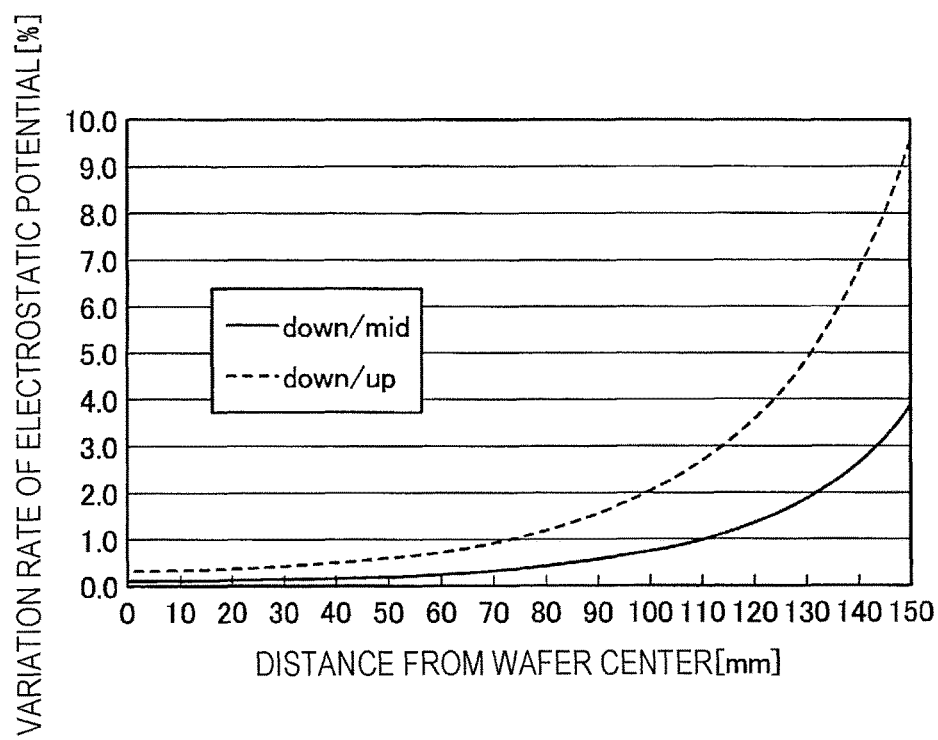
FIG. 8 is a view illustrating an example of the variation rate of electrostatic potential.

FIG. 8 is a view illustrating an example of the variation rate of electrostatic potential. Referring to FIGS. 7 and 8, it can be appreciated that the variation amount of electrostatic potential depending on the insertion amount of the split electrode 101 increases as it approaches the edge of the semiconductor wafer W. From this result, it can be appreciated that the distribution of plasma in the edge portion may be more effectively controlled in the plane of the semiconductor wafer W.

Figure 9:
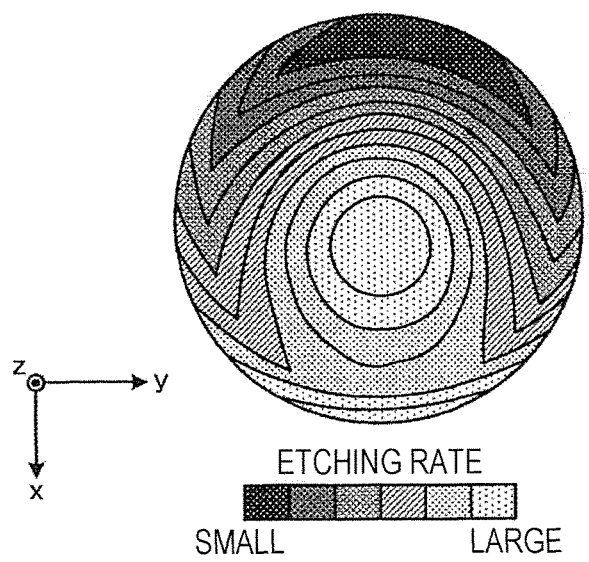
FIG. 9 is a view illustrating an example of the bias of the etching rate.

For example, as illustrated in FIG. 9, when the etching rate of the semiconductor wafer W is bias to the x-direction (the lower side of FIG. 9) in the plane of the semiconductor wafer W, the insertion amount of the split electrode 101, which is provided in the x-direction when viewing from the center (the axis A) of the semiconductor wafer W, is controlled. For example, when the plurality of distribution adjustment units 100 are arranged as illustrated in FIG. 2, the split electrodes 101 are moved upward in the distribution adjustment units 100-6 to 100-8, which are provided in the x-direction when viewing from the axis A. Thereby, in the direction of the distribution adjustment units 100-6 to 100-8 from the axis A, the impedance between the plasma and the ground increases, and the high frequency power decreases. Thus, the plasma decreases in the direction of the distribution adjustment units 100-6 to 100-8 from the axis A.

In addition, for example, when the plurality of distribution adjustment units 100 are arranged as illustrated in FIG. 2, the split electrodes 101 are moved downward in the distribution adjustment units 100-12, 100-1 and 100-2, which are provided in the opposite direction to the x-direction when viewing from the axis A. Thereby, in the direction of the distribution adjustment units 100-12, 100-1 and 100-2 from the axis A, the impedance between the plasma and the ground decreases, and the high frequency power increases. Thus, the plasma increases in the direction of the distribution adjustment units 100-12, 100-1 and 100-2 from the axis A.

Figure 10:
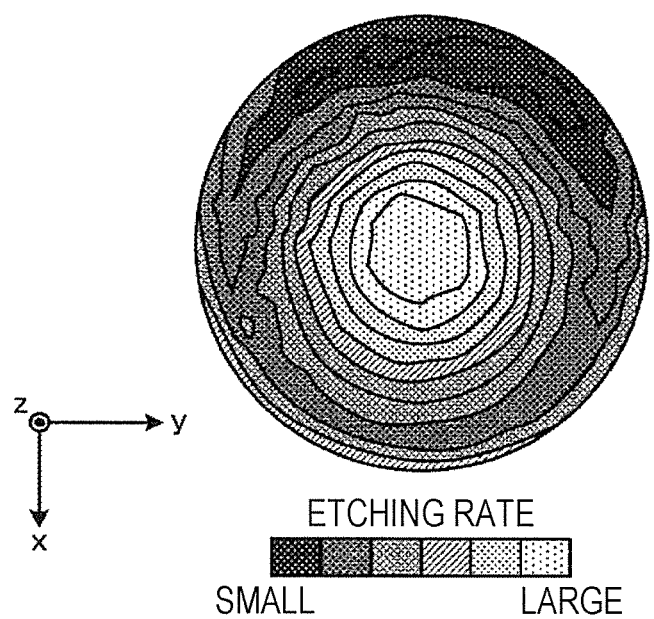
FIG. 10 is a view illustrating an example of the distribution of the etching rate that is corrected by the distribution adjustment unit.

Thereby, the plasma decreases in the x-direction, and increases in the opposite direction to the x-direction. Thereby, the distribution of plasma tilts in the opposite direction of the x-direction, compared to the distribution when the distribution of the etching rate illustrated in FIG. 9 is formed. Thus, for example, as illustrated in FIG. 10, the bias of the etching rate is suppressed.

As is apparent from the above description, according to the plasma processing apparatus 10 of the present exemplary embodiment, the distribution of the plasma in the peripheral direction and the diametric direction may be controlled at the same time by independently controlling the insertion amount of the plurality of split electrodes 101, which are equidistantly arranged in the peripheral direction. Thus, the uniformity of the plasma generated in the plasma processing apparatus 10 may be improved.

Figure 11:
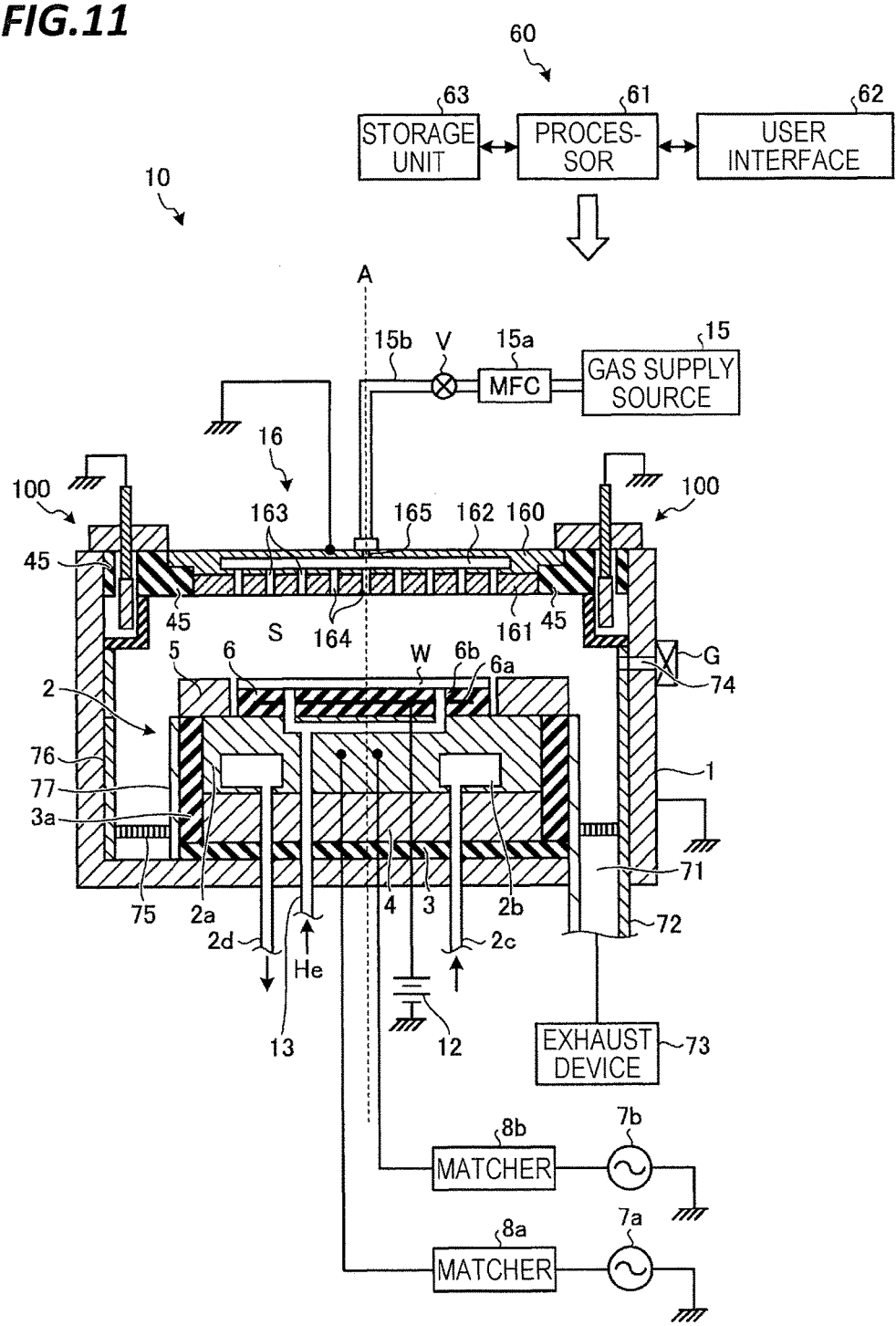
FIG. 11 is a cross-sectional view illustrating another example of the plasma processing apparatus.

In addition, in the above first exemplary embodiment, although high frequency power for plasma generation, which is generated by the high frequency power source 7a, is applied to the upper electrode 16 via the matcher 8a, the technology disclosed herein is not limited thereto. For example, as illustrated in FIG. 11, high frequency power for plasma generation, which is generated by the high frequency power source 7a, may be applied to the lower electrode 2a via the matcher 8a. FIG. 11 is a cross-sectional view illustrating another example of the plasma processing apparatus 10. In this case, the ceiling plate support unit 160 is grounded directly or through an element (e.g., a condenser).

In the example of FIG. 11, the lower electrode 2a functions as a cathode to which high frequency power for plasma generation is applied. Meanwhile, with respect to the high frequency power for plasma generation, the upper electrode 16 and each split electrode 101 function as an anode that is a counter electrode with respect to the lower electrode 2a. In this case, the lower electrode 2a is an example of the first electrode, and the upper electrode 16 and the plurality of split electrodes 101 are an example of the second electrode. In addition, the upper electrode 16 is an example of the central portion in the second electrode, and the plurality of split electrodes 101 are an example of the peripheral portion arranged around the upper electrode 16.

In addition, although the split electrode 101 of the first exemplary embodiment includes the support rod 102 and the plate portion 103, the technique disclosed herein is not limited thereto, and each split electrode 101 may be a single rod-shaped conductor having no plate portion 103.

In addition, in the first exemplary embodiment, although the actuator 104 of each distribution adjustment unit 100 moves the split electrode 101 in the vertical direction, in another example, the actuator 104 may move the split electrode 101 in the diametric direction of the circle, of which the center axis is the axis A. In addition, the actuator 104 may move the split electrode 101 in the vertical direction and in the diametric direction of the circle, of which the center axis is the axis A.

Second Exemplary Embodiment

<Configuration of Distribution Adjustment Unit 100>

In the above first exemplary embodiment, the plurality of distribution adjustment units 100 are provided in one column along the sidewall of the chamber 1 around the processing space S. The second exemplary embodiment differs from the first exemplary embodiment in that the plurality of distribution adjustment units 100 are concentrically provided in plural columns along the sidewall of the chamber 1 around the processing space S.

Figure 12:
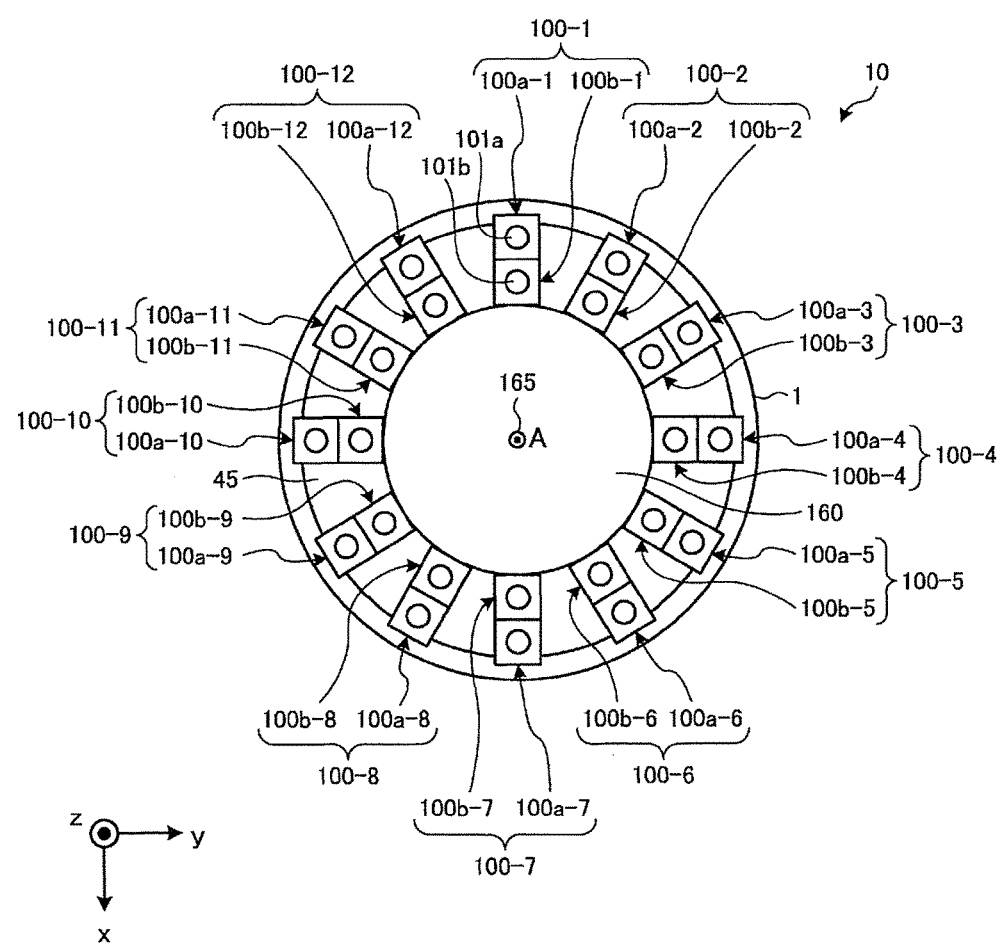
FIG. 12 is a view illustrating an example of the top side of the plasma processing apparatus in a second exemplary embodiment.

FIG. 12 is a view illustrating an example of the top surface of the plasma processing apparatus 10 in the second exemplary embodiment. The plasma processing apparatus 10 of the present exemplary embodiment is, for example, as illustrated in FIG. 12, provided with the plurality of distribution adjustment units 100 along the sidewall of the chamber 1. Each distribution adjustment unit 100 includes a distribution adjustment unit 100a and a distribution adjustment unit 100b. The plurality of distribution adjustment units 100 and the plurality of distribution adjustment units 100b are arranged along respective two concentric circles, of which the center axis is the axis A. In the example of FIG. 12, the distribution adjustment units 100a-1 to 100a-12 are provided at the sidewall side of the chamber 1, and the distribution adjustment units 100b-1 to 100b-12 are provided at the axis A side.

Figure 13:
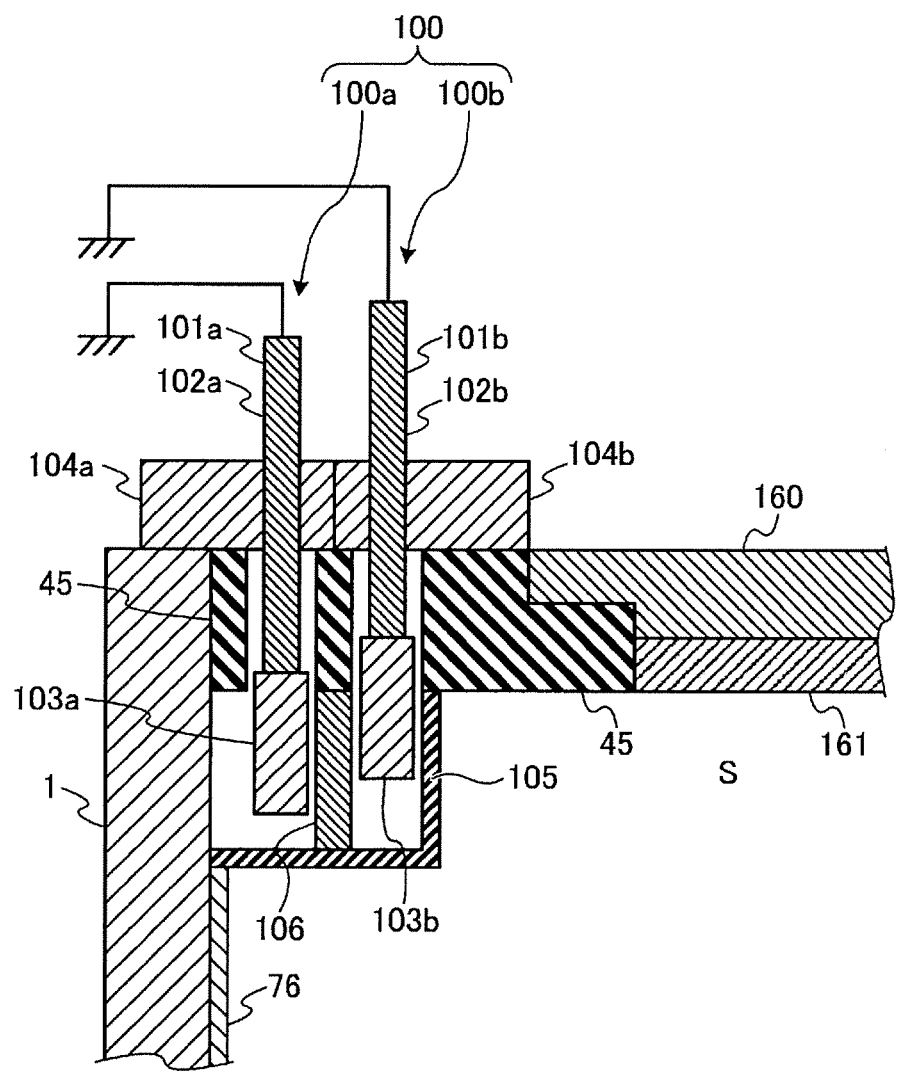
FIG. 13 is an enlarged cross-sectional view illustrating an example of the distribution adjustment unit in the second exemplary embodiment.

FIG. 13 is an enlarged cross-sectional view illustrating an example of the distribution adjustment unit 100 in the second exemplary embodiment. The distribution adjustment unit 100a includes a split electrode 101a and an actuator 104a. The split electrode 101a includes a support rod 102a and a plate portion 103a. The distribution adjustment unit 100b includes a split electrode 101b and an actuator 104b. The split electrode 101b includes a support rod 102b and a plate portion 103b. A dielectric 106 is disposed between the split electrode 101a and the split electrode 101b. When the dielectric 106 is disposed between the split electrode 101a and the split electrode 101b, the variation amount of the impedance between the plasma and the ground may increase depending on the movement of the split electrode 101a and the split electrode 101b in the vertical direction.

Here, in the first exemplary embodiment, the plurality of distribution adjustment units 100 are arranged in a column along the sidewall of the chamber 1. Therefore, the distribution of the impedance in the vertical direction greatly varies by the movement of the split electrodes 101 in the vertical direction. To this end, in the present exemplary embodiment, the distribution adjustment units 100a and the distribution adjustment units 100b are arranged in the diametric direction. Therefore, the distribution of the impedance in the vertical direction may decrease by independently controlling the movement of the split electrodes 101a in the vertical direction and the movement of the split electrodes 101b in the vertical direction.

<Another Example of Distribution Adjustment Unit 100>

Figure 14:
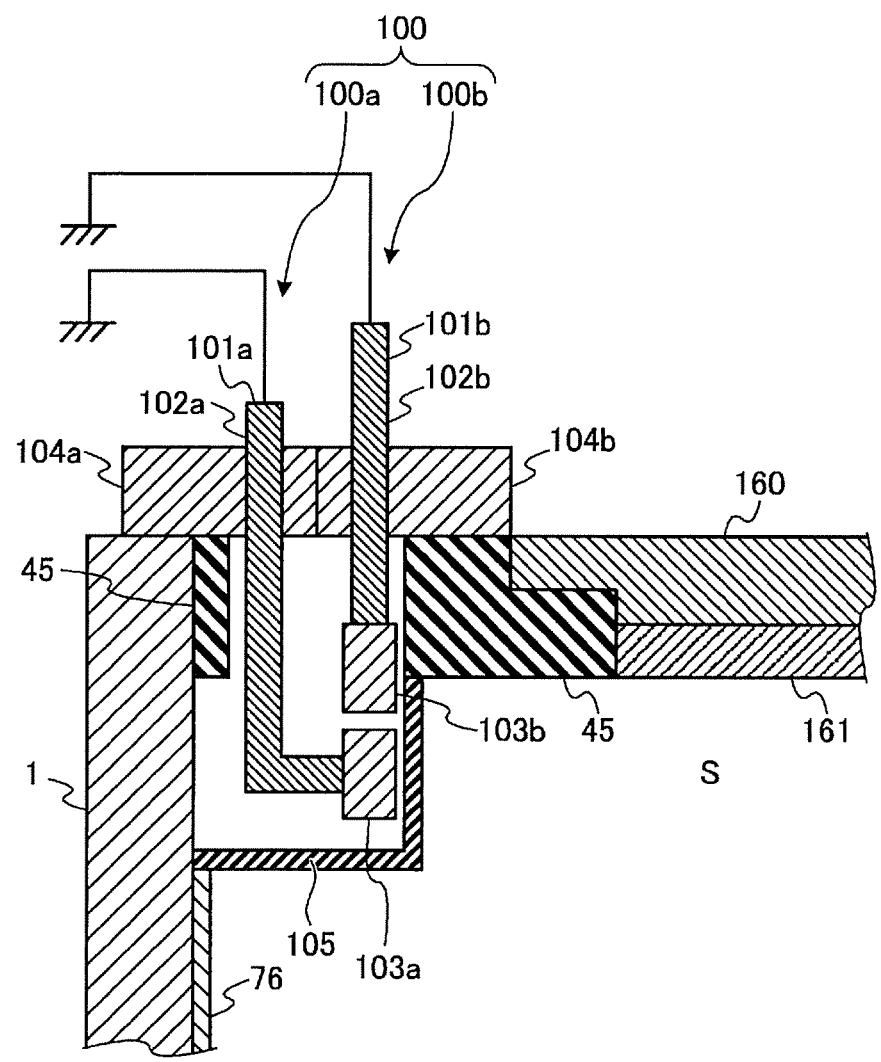
FIG. 14 is an enlarged cross-sectional view illustrating another example of the distribution adjustment unit in the second exemplary embodiment.

The split electrode 101a and the split electrode 101b may be arranged, for example, as illustrated in FIG. 14, such that the plate portion 103a and the plate portion 103b are located to overlap with each other in the vertical direction. FIG. 14 is an enlarged cross-sectional view illustrating another example of the distribution adjustment unit 100 in the second exemplary embodiment.

Figure 15:
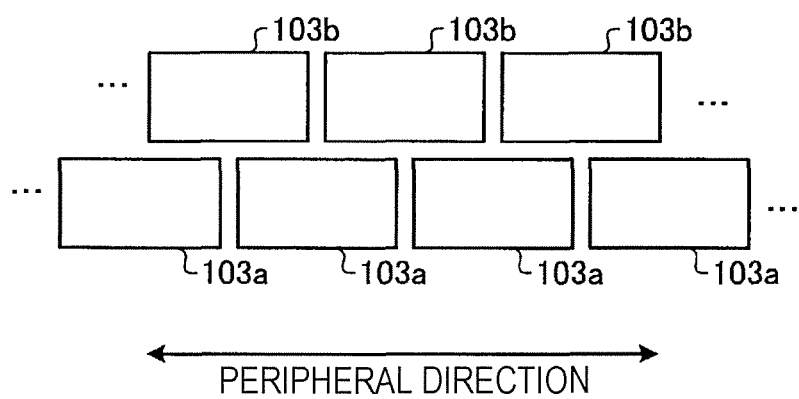
FIG. 15 is a diagram illustrating an example of the arrangement of plate portions of the split electrodes.

In this case, the plurality of plate portions 103a and the plurality of plate portions 103b may be arranged, for example, as illustrated in FIG. 15, such that the gap between the neighboring plate portions 103a in the peripheral direction and the gap between the neighboring plate portions 103b in the peripheral direction are located at different positions in the peripheral direction. Thus, the effect of the gap between the neighboring plate portions 103a in the peripheral direction and the gap between the neighboring plate portions 103b in the peripheral direction on the plasma generated in the processing space S may be reduced.

Figure 16:
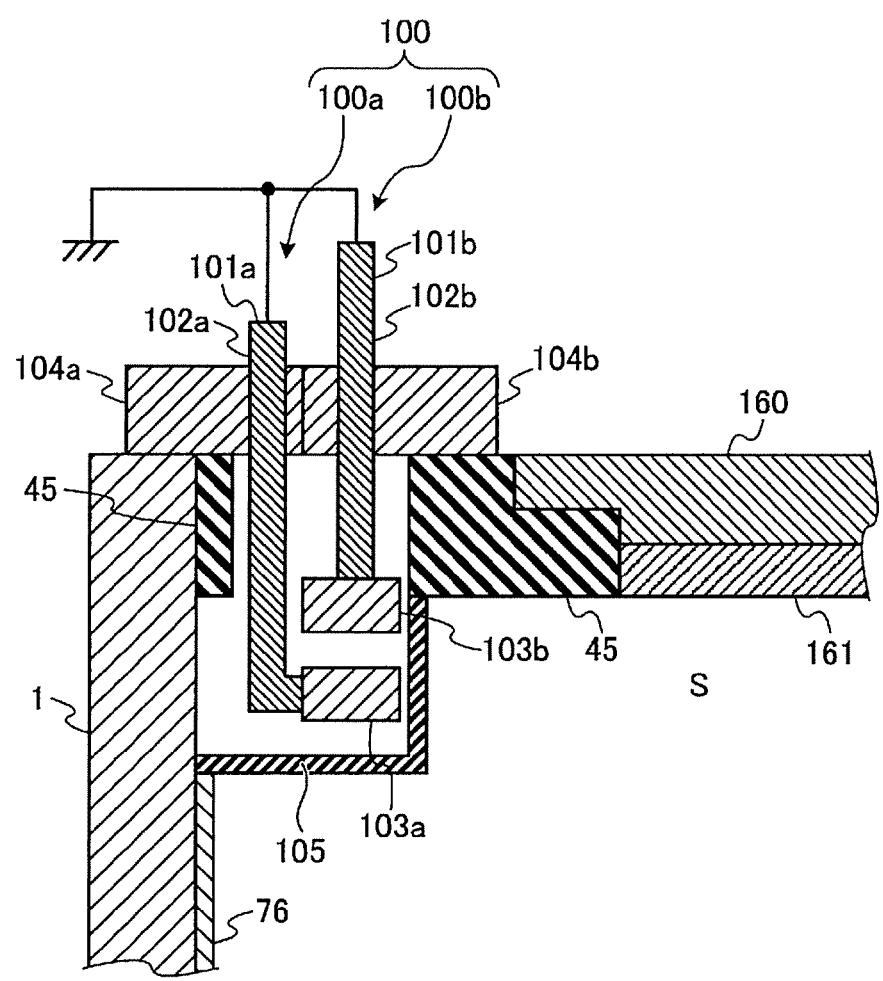
FIG. 16 is an enlarged cross-sectional view illustrating another example of the distribution adjustment unit in the second exemplary embodiment.

In addition, each plate portion 103a and each plate portion 103b may be arranged, for example, as illustrated in FIG. 16, such that the thickness direction thereof is directed to the vertical direction. In addition, in the second exemplary embodiment, although the actuator 104a of each distribution adjustment unit 100a moves the split electrode 101a in the vertical direction, and the actuator 104b of each distribution adjustment unit 100b moves the split electrode 101b in the vertical direction, the technique disclosed herein is not limited thereto. In another example, the actuator 104a may move the split electrode 101a in the diametric direction of the circle, of which the center axis is the axis A, and the actuator 104b may move the split electrode 101b in the diametric direction of the circle, of which the center axis is the axis A. In addition, the actuator 104a may move the split electrode 101a in the vertical direction and in the diametric direction of the circle, of which the center axis is the axis A, and the actuator 104b may move the split electrode 101b in the vertical direction and in the diametric direction of the circle, of which the center axis is the axis A.

As is apparent from the above description, according to the plasma processing apparatus 10 of the present exemplary embodiment, the distribution of the plasma in the peripheral direction and the diametric direction may be controlled at the same time, which may improve the uniformity of the plasma generated in the plasma processing apparatus 10. In addition, according to the plasma processing apparatus 10 of the present exemplary embodiment, variation in the distribution of the plasma in the vertical direction may be reduced.

Third Exemplary Embodiment

In the first exemplary embodiment and the second exemplary embodiment, the impedance between the plasma and the ground is controlled by moving the grounded split electrode 101. To this end, the third exemplary embodiment differs from the first exemplary embodiment and the second exemplary embodiment in that the impedance between the plasma and the ground is controlled by changing the impedance between the split electrode 101 and the ground without moving the split electrode 101.

Figure 17:
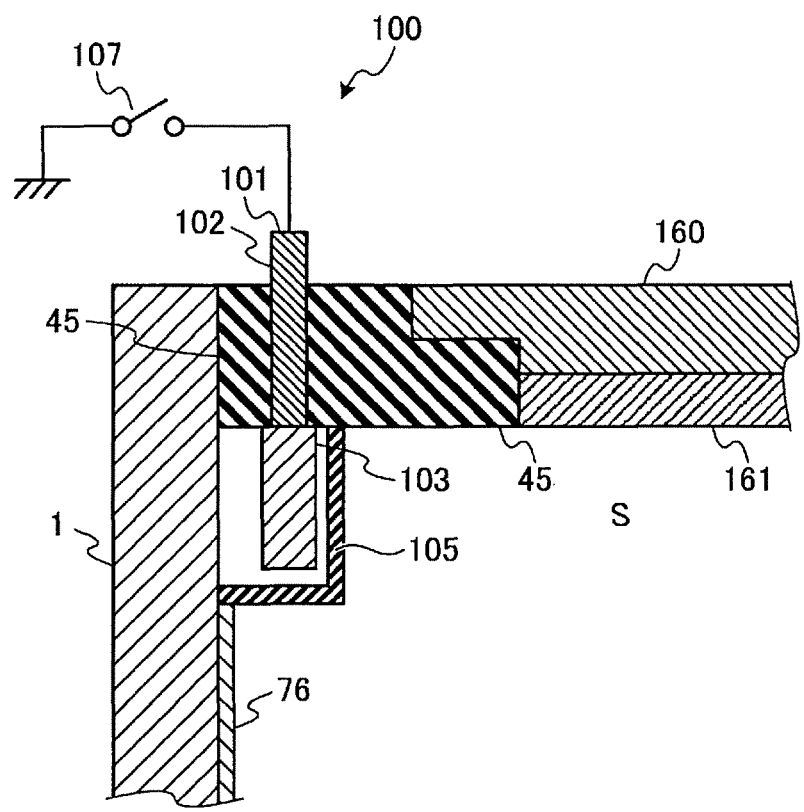
FIG. 17 is an enlarged cross-sectional view illustrating an example of the distribution adjustment unit in a third exemplary embodiment.

FIG. 17 is an enlarged cross-sectional view illustrating an example of the distribution adjustment unit 100 in the third exemplary embodiment. Each distribution adjustment unit 100 includes the split electrode 101 and a switch 107. The split electrode 101 is inserted into the space surrounded by the chamber 1, the insulation member 45 and the insulation member 105 (the space located below the upper electrode 16) through the through-hole formed in the insulation member 45, and is fixed to the insulation member 45. The split electrode 101 is formed of a conductor, and includes the support rod 102 and the plate portion 103.

The support rod 102 is grounded via the switch 107. The switch 107 controls connection and disconnection between the support rod 102 and the ground in response to an instruction from the controller 60. The switch 107 is an example of a first variable impedance circuit. When the switch 107 controls the connection and disconnection between the support rod 102 and the ground, the impedance between the plasma and the ground varies via the split electrode 101. Thereby, the distribution of the plasma in the peripheral direction and the diametric direction may be controlled at the same time, which may improve the uniformity of the plasma generated in the plasma processing apparatus 10.

Figure 18:
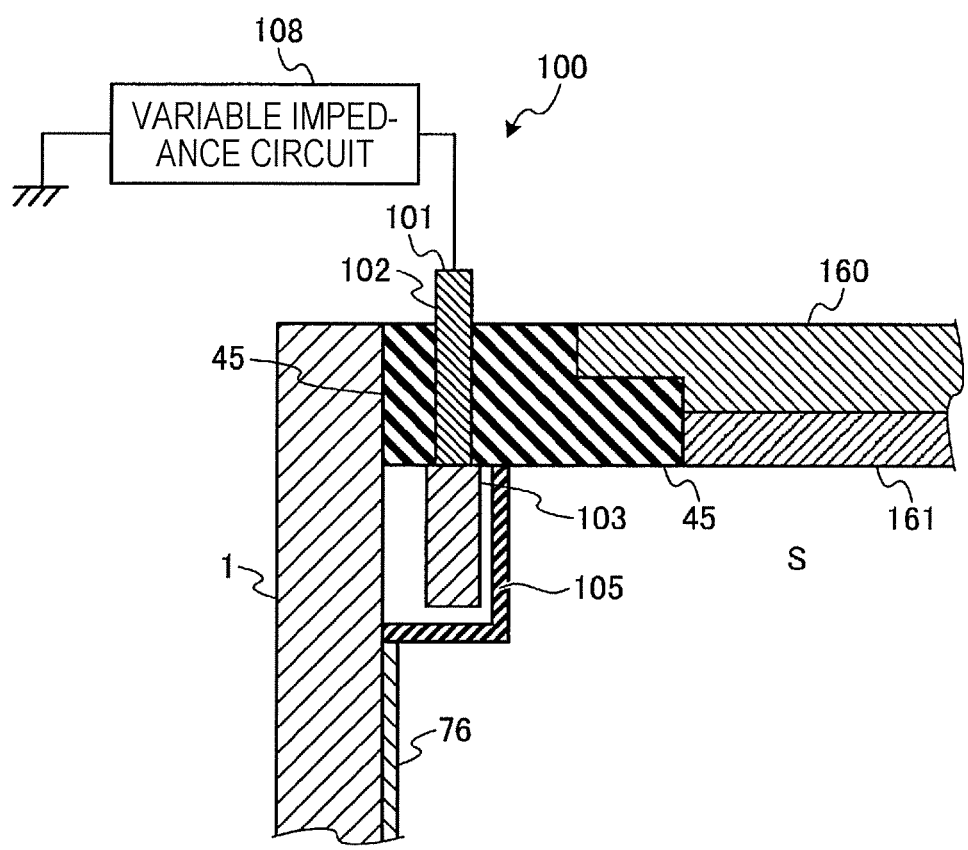
FIG. 18 is an enlarged cross-sectional view illustrating another example of the distribution adjustment unit in the third exemplary embodiment.

In addition, the support rod 102 may be grounded, for example, as illustrated in FIG. 18, via a variable impedance circuit 108, instead of the switch 107. FIG. 18 is an enlarged cross-sectional view illustrating another example of the distribution adjustment unit 100 in the third exemplary embodiment. The variable impedance circuit 108 includes a circuit configured using at least one of a resistor, a condenser, and an inductor. The variable impedance circuit 108 is an example of the first variable impedance circuit. The variable impedance circuit 108 varies the impedance between the support rod 102 and the ground in response to an instruction from the controller 60. Through the use of the variable impedance circuit 108, the impedance between the support rod 102 and the ground may be more precisely and closely controlled. In addition, the variable impedance circuit 108 may independently change the resistance and reactance between the support rod 102 and the ground.

Figure 19:
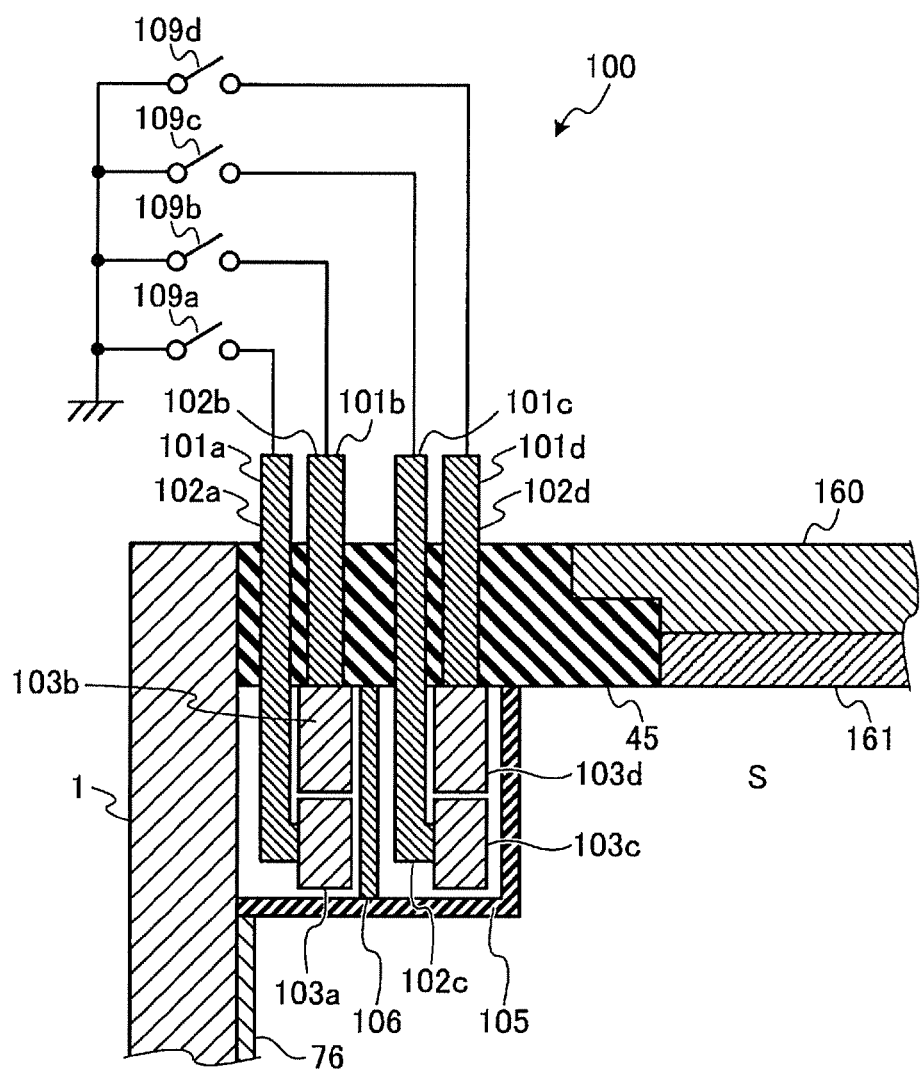
FIG. 19 is an enlarged cross-sectional view illustrating another example of the distribution adjustment unit in the third exemplary embodiment.

In addition, for example, as illustrated in FIG. 19, the plurality of plate portions 103a to 103d may be arranged in the vertical direction and the diametric direction, and the impedance between each of the plate portions 103a to 103d and the ground may be controlled. FIG. 19 is an enlarged cross-sectional view illustrating another example of the distribution adjustment unit 100 in the third exemplary embodiment.

For example, as illustrated in FIG. 19, the split electrode 101a is inserted into the space surrounded by the chamber 1, the insulation member 45, and the insulation member 105 (the space located below the upper electrode 16) through the through-hole formed in the insulation member 45, and is fixed to the insulation member 45. The split electrode 101a is formed of a conductor, and includes the support rod 102a and the plate portion 103a. The support rod 102a is grounded via a switch 109a. The switch 109a controls the connection and disconnection between the support rod 102a and the ground in response to an instruction from the controller 60.

The split electrode 101b is inserted into the space surrounded by the chamber 1, the insulation member 45, and the insulation member 105 (the space located below the upper electrode 16) through the through-hole formed in the insulation member 45, and is fixed to the insulation member 45. The split electrode 101b is formed of a conductor, and includes the support rod 102b and the plate portion 103b. The support rod 102b is grounded via a switch 109b. The switch 109b controls connection and disconnection between the support rod 102b and the ground in response to an instruction from the controller 60.

The split electrode 101c is inserted into the space surrounded by the chamber 1, the insulation member 45, and the insulation member 105 (the space located below the upper electrode 16) through the through-hole formed in the insulation member 45, and is fixed to the insulation member 45. The split electrode 101c is formed of a conductor, and includes the support rod 102c and the plate portion 103c. The support rod 102c is grounded via a switch 109c. The switch 109c controls connection and disconnection between the support rod 102c and the ground in response to an instruction from the controller 60.

The split electrode 101d is inserted into the space surrounded by the chamber 1, the insulation member 45, and the insulation member 105 (the space located below the upper electrode 16) through the through-hole formed in the insulation member 45, and is fixed to the insulation member 45. The split electrode 101d is formed of a conductor and includes the support rod 102d and the plate portion 103d. The support rod 102d is grounded via a switch 109d. The switch 109d controls connection and disconnection between the support rod 102d and the ground in response to an instruction from the controller 60.

In addition, in the distribution adjustment unit 100 illustrated in FIG. 19, instead of the switches 109*a* to 109*d*, respective variable impedance circuits may be provided.

As is apparent from the above description, according to the plasma processing apparatus 10 of the present exemplary embodiment, the distribution of the plasma in the peripheral direction and the diametric direction may be controlled at the same time, which may improve the uniformity of the plasma generated in the plasma processing apparatus 10. In addition, according to the plasma processing apparatus 10 of the present exemplary embodiment, because the respective split electrodes 101 are fixed, the actuator 104 for moving the split electrodes 101 may not be provided. Therefore, the space for moving the split electrodes 101 and the space for the arrangement of the actuators 104 may not be required, which may reduce the size of the plasma processing apparatus 10.

Fourth Exemplary Embodiment

In the first to third exemplary embodiments, the impedance between the plasma and the ground in the peripheral direction is controlled by the plurality of distribution adjustment units 100 provided around the processing space S. To this end, in the fourth exemplary embodiment, the upper electrode 16 is divided into the central portion and the peripheral portion, and the peripheral portion is divided into plural portions in the peripheral direction. In addition, the fourth exemplary embodiment differs from the first to third exemplary embodiments in that the impedance between the plasma and the ground in the peripheral direction is controlled by controlling the impedance between each of the divided upper electrodes 16 and the ground.

Figure 20:
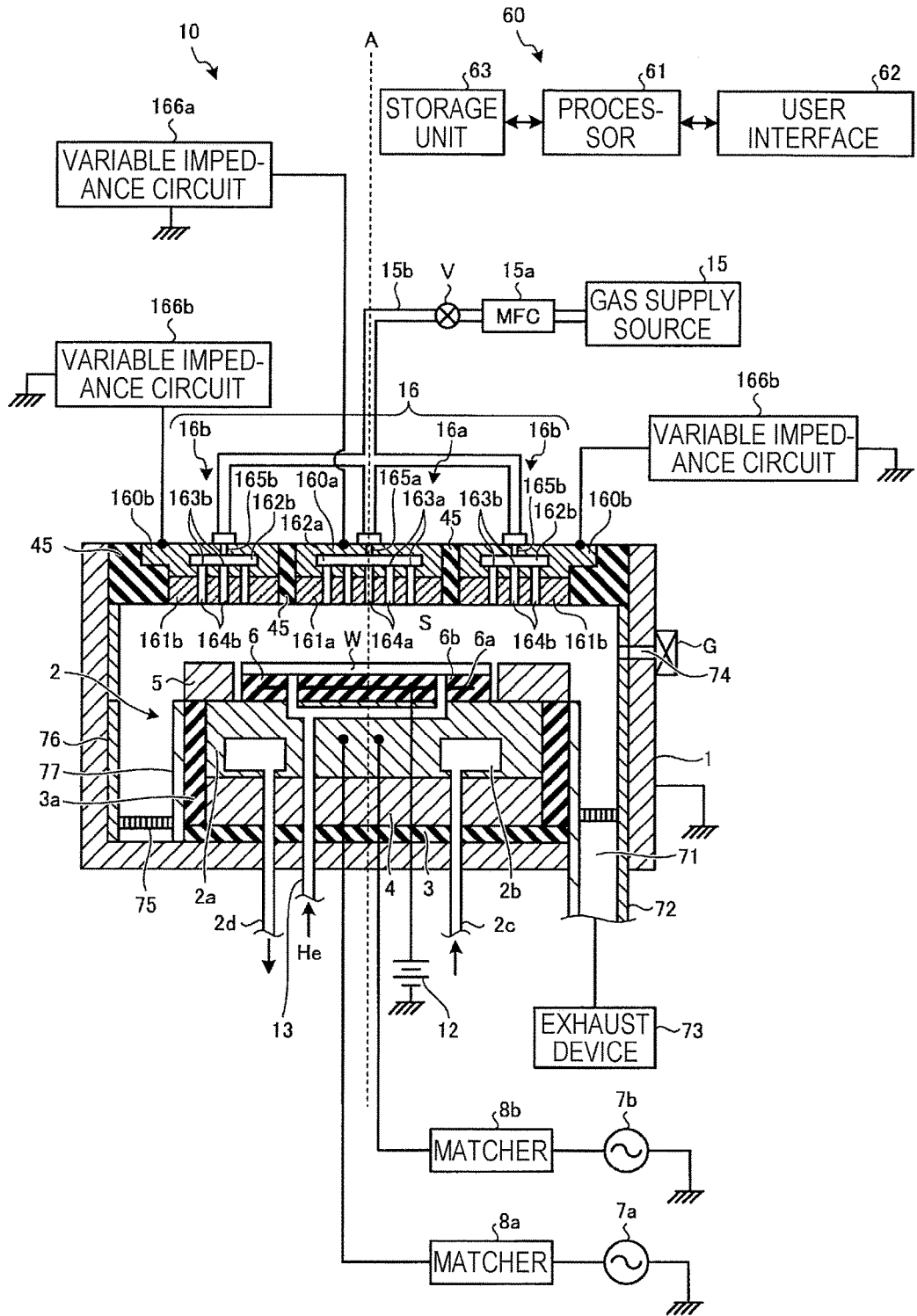
FIG. 20 is a cross-sectional view illustrating an example of the plasma processing apparatus in a fourth exemplary embodiment.
Figure 21:
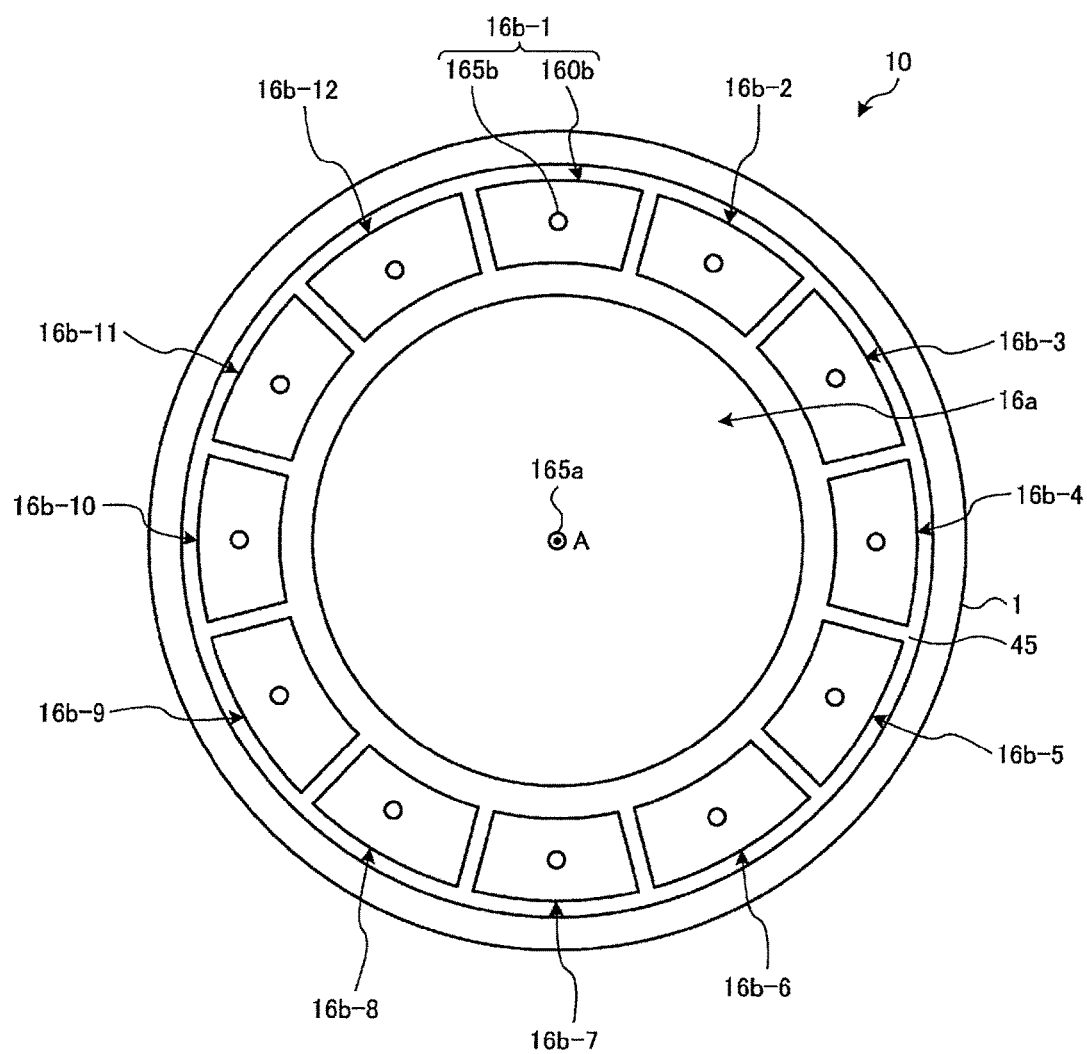
FIG. 21 is a view illustrating an example of the upper side of the plasma processing apparatus in the fourth exemplary embodiment.

FIG. 20 is a cross-sectional view illustrating an example of the plasma processing apparatus 10 in the fourth exemplary embodiment. FIG. 21 is a view illustrating an example of the top surface of the plasma processing apparatus 10 in the fourth exemplary embodiment. In addition, except for the following description, in FIGS. 20 and 21, components designated by the same reference numerals as those of FIG. 1 or FIG. 2 have the same configurations or the same functions as those of FIG. 1 or FIG. 2, and thus the descriptions thereof will be omitted. The upper electrode 16 of the present exemplary embodiment includes an upper electrode 16*a* and a plurality of upper electrodes 16*b*-1 to 16*b*-12 arranged around the upper electrode 16*a*. The upper electrodes 16*b*-1 to 16*b*-12 are substantially equidistantly arranged in an annular form about the axis A. The upper electrode 16*a* and the plurality of upper electrodes 16*b*-1 to 16*b*-12 are insulated by the insulation member 45. In addition, the plurality of upper electrodes 16*b*-1 to 16*b*-12 are insulated from each other by the insulation member 45.

The upper electrode 16*a* is supported in the upper portion of the chamber 1 via the insulating member 45. The upper electrode 16*a* includes a ceiling plate support unit 160*a* and an upper ceiling plate 161*a*. The ceiling plate support unit 160*a* is formed of, for example, aluminum having an anodized surface in a substantially disc shape, and detachably supports the upper ceiling plate 161*a* therebelow. The upper ceiling plate 161*a* is formed of, for example, a silicon-containing material (e.g., Si, SiC or quartz) into a substantially disc shape.

The ceiling plate support unit 160*a* is grounded via a variable impedance circuit 166*a*. In addition, as another example, the ceiling plate support unit 160*a* may be grounded without using the variable impedance circuit 166*a*. The variable impedance circuit 166*a* is an example of a second variable impedance circuit. A gas diffusion chamber 162*a* is provided inside the ceiling plate support unit 160*a*. The gas diffusion chamber 162*a* is provided with a plurality of gas distribution holes 163*a*. The plurality of gas distribution holes 163*a* are formed in the lower portion of the gas diffusion chamber 162*a* at substantially equal intervals concentrically around the axis A.

A plurality of gas distribution holes 164*a* are provided in the upper ceiling plate 161*a* at substantially equal intervals concentrically around the axis A. Each gas distribution hole 164*a* communicates with the gas distribution hole 163*a*. The ceiling plate support unit 160*a* is provided with a gas introduction hole 165*a* for introducing the processing gas into the gas diffusion chamber 162*a*. One end of the pipe 15*b* is connected to the valve V, and the other end is diverged into plural parts so that one of them is connected to the gas introduction hole 165*a*. The processing gas supplied from the gas supply source 15 is supplied to the gas diffusion chamber 162*a* through the pipe 15*b* and the gas introduction hole 165*a*, thereby being diffused in a shower form and supplied into the chamber 1 through the gas distribution holes 163*a* and 164*a*.

Each of the upper electrodes 16*b* is supported in the upper portion of the chamber 1 via the insulation member 45. The upper electrode 16*b* includes the ceiling plate support unit 160*b* and the upper ceiling plate 161*b*. The ceiling plate support unit 160*b* is formed of, for example, aluminum having an anodized surface, and detachably supports the upper ceiling plate 161*b* therebelow. The upper ceiling plate 161*b* is formed of, for example, a silicon-containing material (e.g., Si, SiC or quartz).

Each ceiling plate support unit 160*b* is grounded via a variable impedance circuit 166*b*, which is provided on the upper electrode 16*b* in a one-to-one ratio. The gas diffusion chamber 162*b* is provided inside the ceiling plate support unit 160*b*. The gas diffusion chamber 162*b* is provided with a plurality of gas distribution holes 163*b*. The plurality of gas distribution holes 163*b* are formed in the lower portion of the gas diffusion chamber 162*b* at substantially equal intervals concentrically around the axis A in an annular form.

A plurality of gas distribution holes 164*b* are formed in each upper ceiling plates 161*b* at substantially equal intervals concentrically around the axis A in an annular form. Each gas distribution hole 164*b* communicates with the gas distribution hole 163*b*. Each ceiling plate support unit 160*b* is provided with a gas introduction hole 165*b* for introducing the processing gas into the gas diffusion chamber 162*b*. One end of the pipe 15*b* is connected to the valve V, and the other end is diverged into plural parts so that one of them is connected to the gas introduction hole 165*b*. The processing gas supplied from the gas supply source 15 is supplied to the gas diffusion chamber 162*b* through the pipe 15*b* and the gas introduction hole 165*b*, thereby being diffused in a shower form and supplied into the chamber 1 through the gas distribution holes 163*b* and 164*b*.

In the fourth exemplary embodiment, high-frequency power for plasma generation, which is generated by the high frequency power source 7*a*, is applied to the lower electrode 2*a* via the matcher 8*a*. In the fourth exemplary embodiment, the lower electrode 2*a* functions as a cathode to which high frequency power for plasma generation is applied. Meanwhile, with respect to the high frequency power for plasma generation, each of the upper electrode 16*a* and the plurality of upper electrodes 16*b*-1 to 16*b*-12 functions as a counter anode facing the lower electrode 2*a*. In this case, the lower electrode 2*a* is an example of the first electrode, and the upper electrode 16a and the plurality of upper electrodes 16b-1 to 16b-12 are an example of the second electrode. In addition, the upper electrode 16a is an example of the central portion of the second electrode, and the plurality of upper electrodes 16b-1 to 16b-12 are an example of the peripheral portion disposed around the upper electrode 16. In addition, each of the plurality of upper electrodes 16b-1 to 16b-12 is an example of the split electrode.

In the present exemplary embodiment, the impedance between the plasma and the ground may be controlled via the upper electrode 16b by independently controlling the impedance of the variable impedance circuit 166b, which is connected to each of the plurality of upper electrodes 16b-1 to 16b-12. Thus, the distribution of the plasma in the peripheral direction and the diametric direction may be controlled at the same time, which may improve the uniformity of the plasma generated in the plasma processing apparatus 10.

Figure 22:
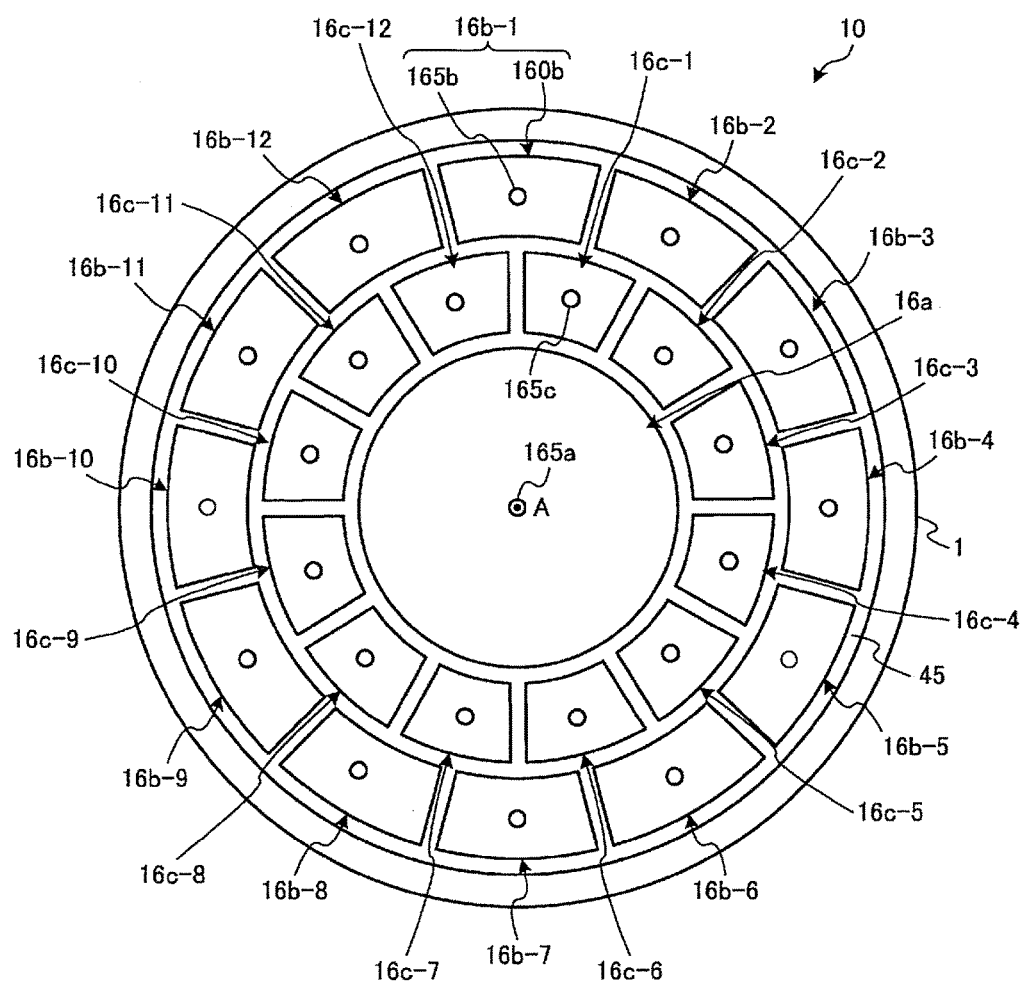
FIG. 22 is a view illustrating another example of the top side of the plasma processing apparatus in the fourth exemplary embodiment.

In addition, in the plasma processing apparatus 10, although the plurality of upper electrodes 16b-1 to 16b-12 are arranged in one column in an annular form about the axis A around the upper electrode 16a, for example, as illustrated in FIG. 22, the upper electrodes 16b-1 to 16b-12 may be arranged in two or more columns. FIG. 22 is a view illustrating another example of the top surface of the plasma processing apparatus 10 in the fourth exemplary embodiment. In the example of FIG. 22, the plurality of upper electrodes 16b-1 to 16b-12 are arranged in one column in an annular form about the axis A, and additionally, inside the column, a plurality of upper electrodes 16c-1 to 16c-12 are arranged in one column in an annular form about the axis A.

In addition, the respective upper electrodes 16b and the respective upper electrodes 16c may be arranged, for example, as illustrated in FIG. 22, such that the gap between the two neighboring upper electrodes 16b and the gap between the two neighboring upper electrodes 16c do not overlap each other in the diametric direction of a cylinder around the axis A. Thereby, the effect of the gap between the neighboring upper electrodes 16b in the peripheral direction and the gap between the neighboring upper electrodes 16c in the peripheral direction on the plasma generated in the processing space S may be reduced.

Fifth Exemplary Embodiment

Figure 23:
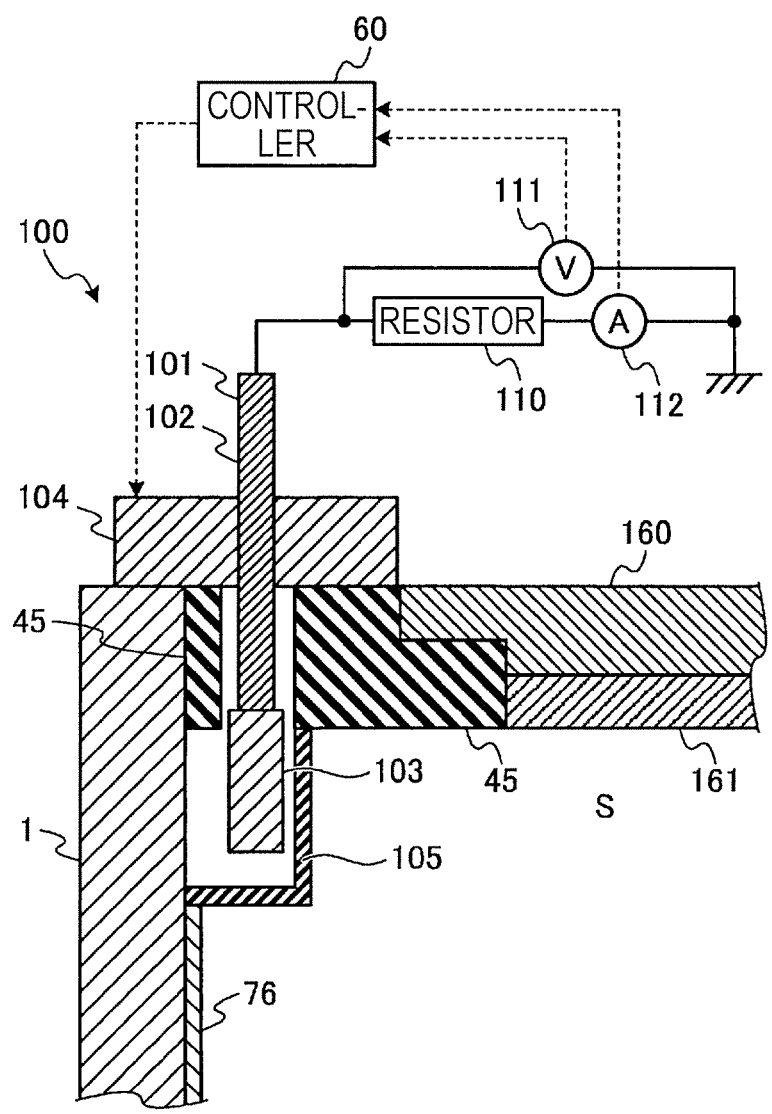
FIG. 23 is an enlarged cross-sectional view illustrating an example of the distribution adjustment unit in a fifth exemplary embodiment.

In the fifth exemplary embodiment, the voltage and current of each distribution adjustment unit 100 are measured, and the split electrode 101 of each distribution adjustment unit 100 is moved based on the measured results. In addition, in the fifth exemplary embodiment, the voltage and current are measured, and the split electrode 101 of each distribution adjustment unit 100 is moved based on the measured results. In another example, one of the voltage and current may be measured, and the split electrode 101 of each distribution adjustment unit 100 may be moved based on the measured result. FIG. 23 is an enlarged cross-sectional view illustrating an example of the distribution adjustment unit 100 in the fifth exemplary embodiment. Each distribution adjustment unit 100 includes the split electrode 101, the actuator 104, a resistor 110, a voltmeter 111, and an ammeter 112. In addition, except for the following description, in FIG. 23, components designated by the same reference numerals as those of FIG. 3 have the same configurations or the same functions as the components of FIG. 3, and thus the descriptions thereof will be omitted.

The support rod 102 is grounded via the resistor 110 and the ammeter 112. The ammeter 112 measures a current flowing to the split electrode 101, and outputs the measured result to the controller 60. The voltmeter 111 measures a voltage of the split electrode 101 and outputs the measured result to the controller 60. The controller 60 determines the adjustment amount of impedance of the split electrode 101 based on the voltage value measured by the voltmeter 111 and the current value measured by the ammeter 112 with respect to the respective distribution adjustment units 100 in the state in which plasma is being generated in the chamber 1. The controller 60 calculates, for example, the control amount of impedance for causing the measured voltage value, the measured current value, or both the two to satisfy a predetermined relationship with respect to the respective distribution adjustment units 100.

The controller 60 calculates, for example, the control amount of impedance for causing the impedance between the plasma and the ground to be the same with respect to the respective distribution adjustment units 100. The controller 60 calculates, for example, the control amount of impedance for causing the measured voltage value, the measured current value, or both the two to be the same with respect to the respective distribution adjustment units 100. In addition, the controller 60 calculates the moving amount of the split electrode 101 for realizing the calculated control amount of impedance with respect to the respective distribution adjustment units 100. In addition, the controller 60 indicates the calculated moving amount to the actuator 104 of each distribution adjustment unit 100. Thereby, bias of the impedance between the plasma and the ground may be reduced among the plurality of distribution adjustment units 100. Thus, the uniformity of the plasma generated in the plasma processing apparatus 10 may be improved.

<Processing of Controller 60>

Figure 24:
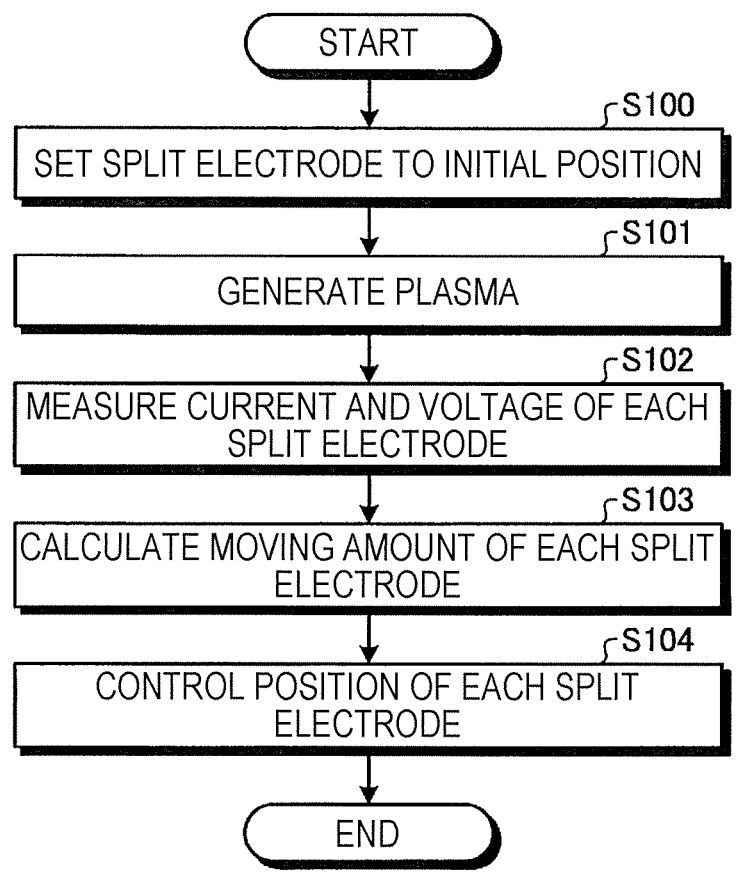
FIG. 24 is a flowchart illustrating an example of a processing of a controller in the fifth exemplary embodiment.

FIG. 24 is a flowchart illustrating an example of a processing of the controller 60 in the fifth exemplary embodiment.

First, the controller 60 issues an instruction to the actuator 104 of each distribution adjustment unit 100 to set the split electrode 101 of the distribution adjustment unit 100 to an initial position. The actuator 104 of each distribution adjustment unit 100 moves the split electrode 101 to the initial position in response to the instruction from the controller 60. The initial position is, for example, the position at which the insertion amount of the split electrode 101 is half the total insertion amount.

Next, the controller 60 exhausts the inside of the chamber 1 to a vacuum state, and supplies a processing gas into the chamber 1 so as to apply high frequency power to the upper electrode 16 and the lower electrode 2a, thereby generating plasma of the processing gas in the chamber 1 (S101).

Next, the controller 60 causes the voltmeter 111 to measure a voltage of the split electrode 101 and causes the ammeter 112 to measure current of the split electrode 101 with respect to the respective distribution adjustment units 100 (S102). Then, the controller 60 acquires the voltage value measured by the voltmeter 111 and the current value measured by the ammeter 112 with respect to the respective distribution adjustment units 100. Then, the controller 60 calculates the adjustment amount of impedance of the split electrode 101 based on the acquired voltage value and current value.

Then, the controller 60 calculates the moving amount of the split electrode 101 for realizing the calculated adjustment amount of impedance with respect to the respective distribution adjustment units 100 (S103). In addition, the controller 60 issues an instruction about the calculated moving amount to the actuator 104 of each distribution adjustment unit 100. The actuator 104 of each distribution adjustment unit 100 controls the position of the split electrode 101 in response to the instruction from the controller 60 (S104). In addition, the controller 60 terminates the processing illustrated in this flowchart. In addition, the processing of the steps S102 to S104 may be repeated plural times.

According to the plasma processing apparatus 10 of the present exemplary embodiment, a difference in impedance between the plasma and the ground may be reduced among the plurality of distribution adjustment units 100. Thus, the uniformity of the plasma generated in the plasma processing apparatus 10 may be improved.

<Others>

The present disclosure is not limited to the above exemplary embodiments, and numerous modifications may be made within the scope of the subject matter of the present disclosure.

For example, in combination with the first and second exemplary embodiments and the third exemplary embodiment, the position of each split electrode 101 in the vertical direction may vary, and the impedance between the split electrode 101 and the ground may vary. In addition, in combination with the first to fourth exemplary embodiments and the fifth exemplary embodiment, the position of each split electrode 101 in the vertical direction or the impedance between the split electrode 101 and the ground may vary based on the measured result of at least one of the voltage and current of each split electrode 101.

In addition, in the above embodiment, although a capacitively coupled parallel plate plasma etching apparatus has been described as the plasma processing apparatus 10 by way of example, the technology disclosed herein is not limited thereto. The technology disclosed herein may also be applied to an etching apparatus using another method such as, for example, inductively coupled plasma (ICP), so long as it performs a predetermined processing on the semiconductor wafer W using plasma. In addition, the technology disclosed herein may also be applied to an apparatus for performing a predetermined processing (e.g., film formation or modification) in addition to an etching apparatus, so long as the apparatus performs a predetermined processing on the semiconductor wafer W using a gas.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a first electrode to which high frequency power is applied;
a second electrode configured to function as a counter electrode with respect to the first electrode; and
a controller programmed to control distribution of plasma generated between the first electrode and the second electrode,
wherein the second electrode includes a central portion and a peripheral portion disposed around the central portion,
the peripheral portion includes a plurality of split electrodes divided in a peripheral direction,
a measurement unit connected to each of the plurality of split electrodes and configured to measure at least one of a voltage between the plurality of split electrodes and the ground, and a current flowing to the plurality of split electrodes, and
wherein, for each of the plurality of split electrodes, the controller is further programmed to:
measure at least one of the voltage and the current of each of the plurality of split electrodes by the measurement unit;
determine an impedance between the plasma and the ground via each of the plurality of split electrodes based on at least one of the measured voltage and the current so as to cause at least one of the voltage and the current of each of the plurality of split electrodes to satisfy a predetermined relationship among the plurality of split electrodes; and
control the impedance between the plasma and a ground via each of the plurality of split electrodes such that the impedance becomes the determined impedance.

2. The plasma processing apparatus of claim 1, wherein each of the split electrodes is a grounded conductor, and
wherein, for each split electrode, the controller is further programmed to control the impedance between the plasma and the ground via the split electrode by controlling a position of each split electrode in a direction that is orthogonal to an electrode surface of the first electrode, which faces the second electrode, a position of each split electrode in a direction that is parallel to the electrode surface, or both the positions.

3. The plasma processing apparatus of claim 1, wherein each split electrode is a conductor grounded via a first variable impedance circuit, and
wherein the controller is further programmed to control the impedance between the plasma and the ground via each split electrode by controlling an impedance of the first variable impedance circuit connected to each split electrode.

4. The plasma processing apparatus of claim 3, wherein the first variable impedance circuit is a switch configured to control conduction and non-conduction between the split electrode and the ground.

5. The plasma processing apparatus of claim 3, wherein the first variable impedance circuit includes at least one of a variable resistor, a variable condenser, and a variable inductor.

6. The plasma processing apparatus of claim 1, wherein the split electrode is a plate-shaped conductor, and is disposed around the central portion such that a thickness direction of the split electrode is a diametric direction.

7. The plasma processing apparatus of claim 1, wherein the split electrode is a rod-shaped conductor, and is disposed around the central portion such that a longitudinal direction of the split electrode is the direction orthogonal to the electrode surface of the first electrode facing the second electrode.

8. The plasma processing apparatus of claim 1, wherein the central portion of the second electrode is grounded.

9. The plasma processing apparatus of claim 1, wherein the central portion of the second electrode is grounded via a second variable impedance circuit.

10. The plasma processing apparatus of claim 1, wherein the controller is further programmed to control the impedance between the plasma and the ground such that the impedance between the plasma and the ground varies, thereby controlling a distribution of the plasma generated in a processing space between the first electrode and the second electrode in a peripheral direction and a diametric direction of the processing space, simultaneously, with respect to a central axis of the processing space.

11. A control method of a plasma processing apparatus, the plasma processing apparatus that includes: a first electrode to which high frequency power is applied; a second electrode configured to function as a counter electrode with respect to the first electrode; and a controller configured to control distribution of plasma generated between the first electrode and the second electrode, the second electrode including a central portion and a peripheral portion disposed around the central portion, and the peripheral portion includes a plurality of split electrodes divided in a peripheral direction, wherein the control method comprises:

measuring, by the controller, at least one of a voltage between each split electrode and a ground and a current flowing to the split electrode;

determining, by the controller, an impedance between the plasma and the ground via each split electrode to cause at least one of the voltage and the current of each split electrode to satisfy a predetermined relationship among the plurality of split electrodes; and for each split electrode, controlling, by the controller, the impedance between the plasma and the ground via the split electrode such that the impedance becomes the determined impedance.

\* \* \* \* \*